(12) United States Patent
MacDonald et al.

(10) Patent No.: US 10,720,497 B2
(45) Date of Patent: Jul. 21, 2020

(54) TRANSISTOR HAVING LOW CAPACITANCE FIELD PLATE STRUCTURE

(71) Applicant: Raytheon Company, Waltham, MA (US)

(72) Inventors: Christopher J. MacDonald, Medford, MA (US); Kenneth A. Wilson, Salem, MA (US); Kamal Tabatabaie Alavi, Sharon, MA (US); Adrian D. Williams, Methuen, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/791,771

(22) Filed: Oct. 24, 2017

(65) Prior Publication Data

US 2019/0123150 A1 Apr. 25, 2019

(51) Int. Cl.
| | |
|---|---|
| *H01L 29/40* | (2006.01) |
| *H01L 29/20* | (2006.01) |
| *H01L 29/205* | (2006.01) |
| *H01L 21/311* | (2006.01) |
| *H01L 29/66* | (2006.01) |
| *H01L 29/778* | (2006.01) |
| *H01L 23/31* | (2006.01) |

(52) U.S. Cl.
CPC ...... *H01L 29/402* (2013.01); *H01L 21/31111* (2013.01); *H01L 23/3171* (2013.01); *H01L 23/3192* (2013.01); *H01L 29/2003* (2013.01); *H01L 29/205* (2013.01); *H01L 29/401* (2013.01); *H01L 29/66462* (2013.01); *H01L 29/7786* (2013.01); *H01L 29/7787* (2013.01)

(58) Field of Classification Search
CPC ... H01L 29/40; H01L 29/402; H01L 29/7787; H01L 23/3171
See application file for complete search history.

(56) References Cited

U.S. PATENT DOCUMENTS

| | | |
|---|---|---|
| 7,893,500 B2 | 2/2011 | Wu et al. |
| 7,915,644 B2 | 3/2011 | Wu et al. |
| 8,530,978 B1 | 9/2013 | Chu et al. |
| 8,933,486 B2 | 1/2015 | Wu |
| 8,980,759 B1 | 3/2015 | Carrion et al. |

(Continued)

FOREIGN PATENT DOCUMENTS

CN 101232045 A 7/2008

OTHER PUBLICATIONS

Mikael Ostling, Lecture 7, Etching, IH2655 Spring 2013, KTH Royal Institue of Technology in Stockholm (2003).*

(Continued)

*Primary Examiner* — Cuong Q Nguyen
*Assistant Examiner* — Shih Tsun A Chou
(74) *Attorney, Agent, or Firm* — Daly, Crowley, Mofford & Durkee, LLP

(57) ABSTRACT

A Field Effect Transistor (FET) having a source, drain, and gate disposed laterally along a surface of a semiconductor and a field plate structure: having one end connected to the source; and having a second end disposed between the gate and the drain and separated from the drain by a gap. A dielectric structure is disposed over the semiconductor, having: a first portion disposed under the second end of the field plate structure; and, a second, thinner portion under the gap.

18 Claims, 22 Drawing Sheets

(56) References Cited

U.S. PATENT DOCUMENTS

| | | | |
|---|---|---|---|
| 9,070,756 B2 | 6/2015 | Cal et al. | |
| 9,812,534 B2* | 11/2017 | Zhang | H01L 29/402 |
| 9,917,182 B1* | 3/2018 | Saito | H01L 29/402 |
| 2012/0217544 A1* | 8/2012 | Ohki | H01L 29/402 257/194 |
| 2014/0061659 A1 | 3/2014 | Teplik et al. | |
| 2014/0264360 A1* | 9/2014 | Huang | H01L 29/402 257/76 |
| 2014/0264431 A1* | 9/2014 | Lal | H01L 27/0883 257/121 |
| 2015/0357206 A1 | 12/2015 | McClymonds | |
| 2016/0064538 A1* | 3/2016 | Nakayama | H01L 29/7783 257/20 |
| 2017/0047437 A1* | 2/2017 | Nakayama | H01L 21/2258 |
| 2017/0352754 A1* | 12/2017 | Beach | H01L 29/2003 |
| 2018/0026105 A1* | 1/2018 | Zhang | H01L 29/402 257/367 |
| 2018/0158909 A1* | 6/2018 | Mishra | H01L 29/408 |

OTHER PUBLICATIONS

Williams et al., Etch Rates for Micromaching Processing—Part II, Journal of Microelectromechanical Systems, vol. 12, No. 6, Dec. 2003, pp. 761-778.*

Yngvesson S. (1991) HFETs—Heterojunction Field Effect Transistors. In: Microwave Semiconductor Devices. The Springer International Series in Engineering and Computer Science (VLSI, Computer Architecture and Digital Signal Processing), vol. 134. Springer, Boston, MA (Year: 1991).*

Notification of Transmittal of the International Search Report and the Written Opinion of the ISA dated Jan. 29, 2019 for International Application No. PCT/US2018/054308; 1 Page.

International Search Report dated Jan. 29, 2019 for International Application No. PCT/US2018/054308; 5 Pages.

Written Opinion of the ISA dated Jan. 29, 2019 for International Application No. PCT/US2018/054308; 9 Pages.

* cited by examiner

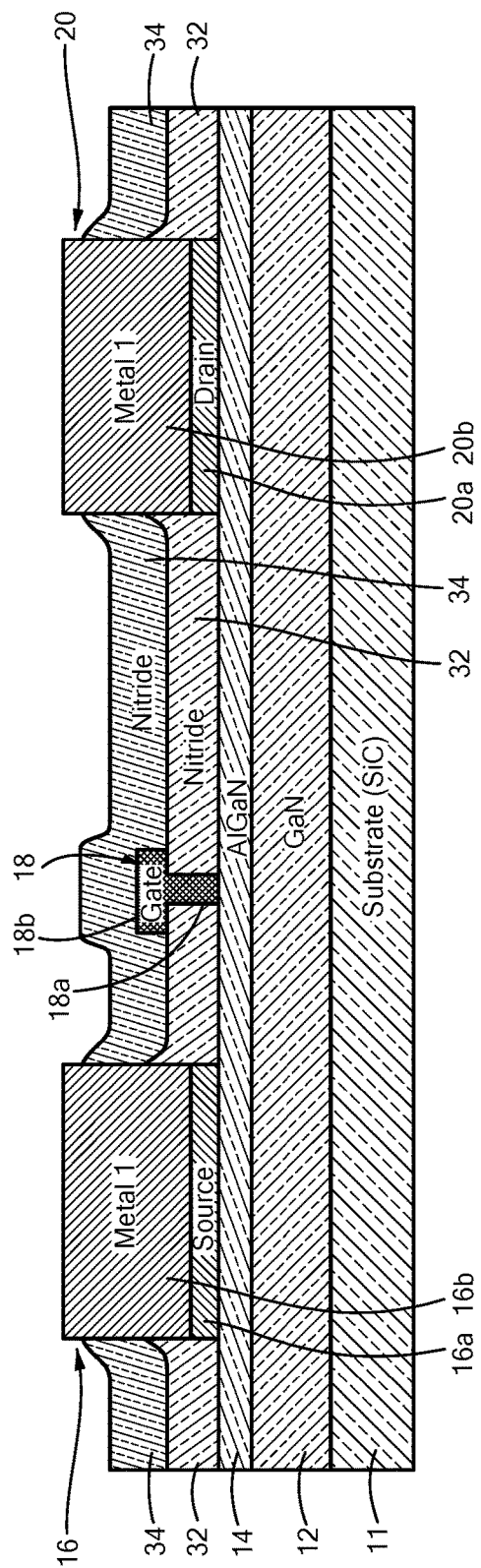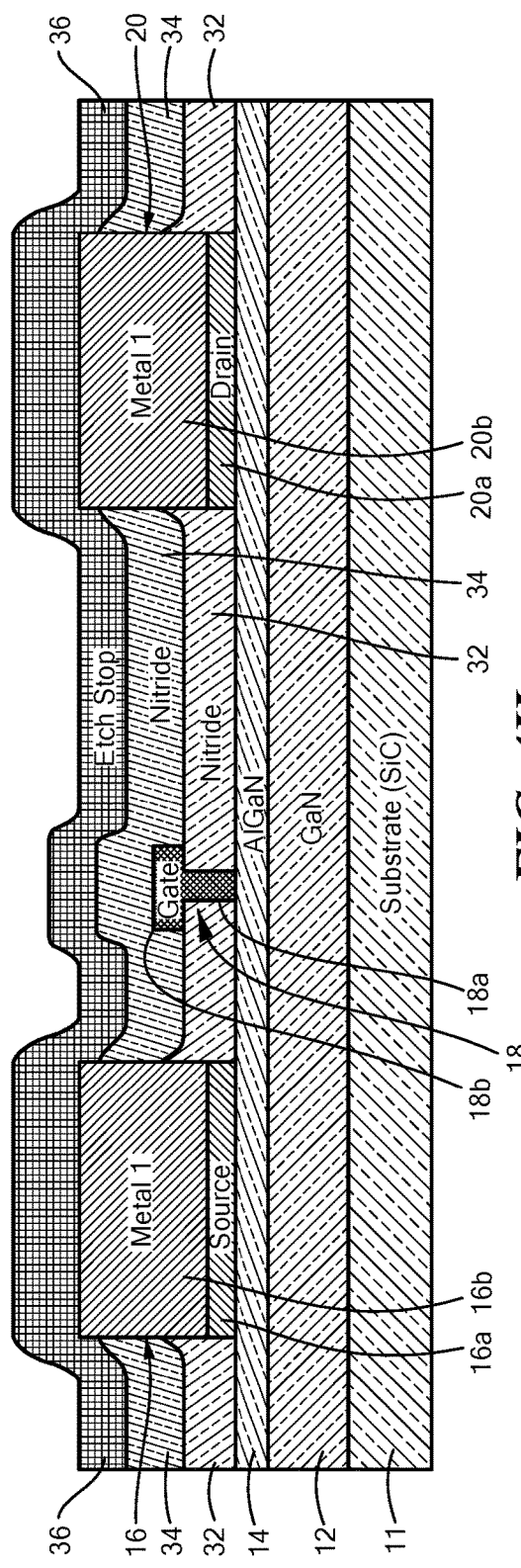
FIG. 4G
FIG. 4H

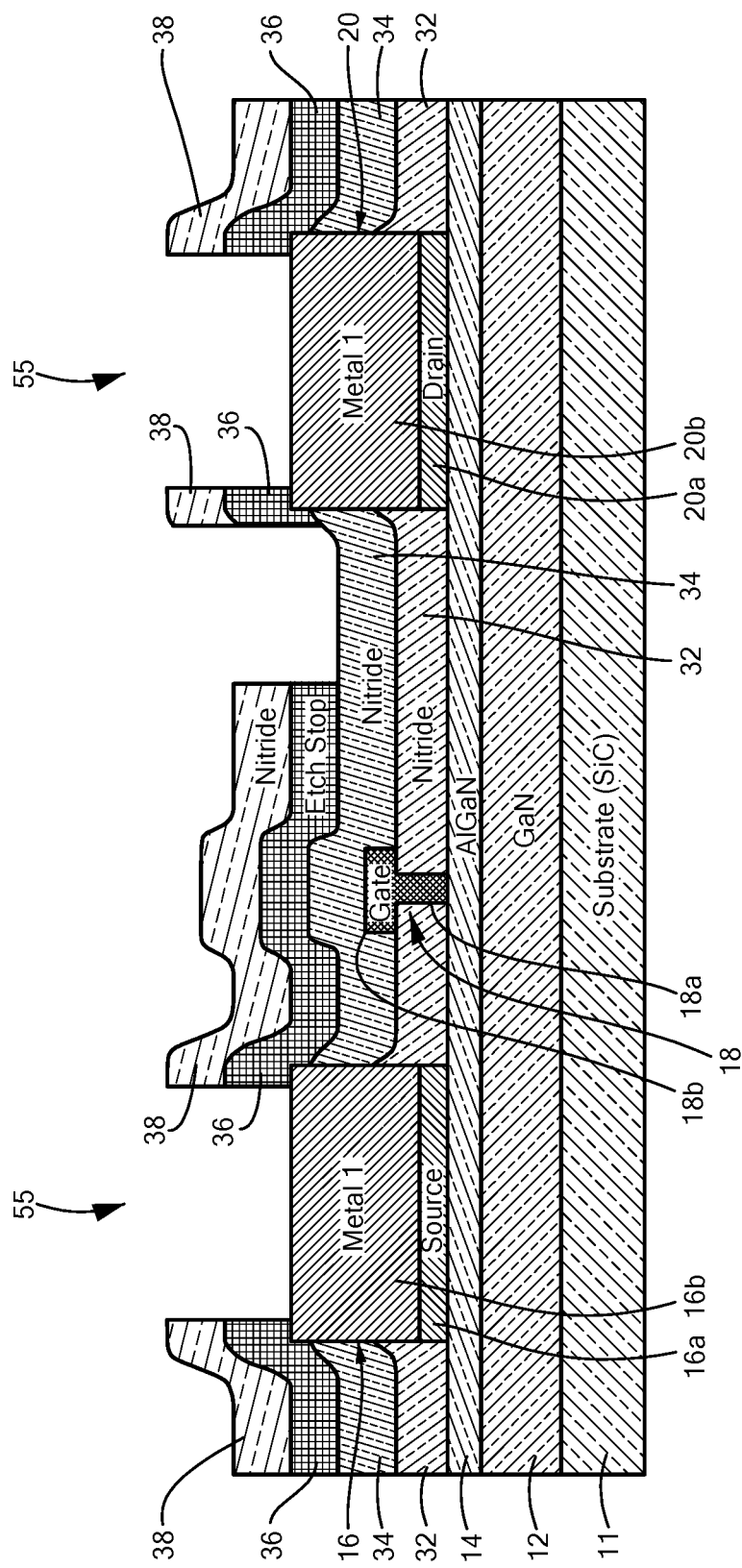

TRANSISTOR HAVING LOW CAPACITANCE FIELD PLATE STRUCTURE

TECHNICAL FIELD

This disclosure relates generally to transistors having field plate structures and more particularly to transistors having low capacitance field plate structures.

BACKGROUND

As is known in the art, field plate structures are used in some transistors to improve the efficiency of such transistors in many high power applications. One such field plate structure used with Field Effect Transistors (FETs) is a so-called source connected field plate (SCFP) structure having one end connected to the source, typically referenced to ground potential, through a SCFP connector section and a second end providing a SCFP region disposed over a region between the gate and the drain but separated or spaced from the drain. Two types of such source connected field plate structures are shown in: FIGS. 1A and 1B; and 2A and 2B, respectively; see for example U.S. Pat. Nos. 7,915,644 and 7,893,500, respectively. In both types, the SCFP structures include one end connected to the source through the SCFP connector section and a second end providing the SCFP region disposed over a region between the gate and the drain, it being noted that the end of the SCFP is spaced from the drain. That is, the two types of FETs differ in that with the type shown in FIGS. 1A and 1B the SCFP is connected to the source by a U-shaped SCFP connector section that does not pass over the semiconductor region, or active region, here for example, aluminum gallium arsenide (AlGaN) which may be a mesa on the substrate; whereas in the type shown in FIGS. 2A and 2B the SCFP structure is connected to the source by a SCFP connector section that does pass, as a canopy, over the semiconductor (or active region). With either type there is a continuous, solid dielectric structure of the same material that extends from the terminating end of the SCPF structure and the drain. Here, the FETs are adapted for use in high power, microwave frequency applications; here GaN FETs having a GaN buffer with an AlGaN semiconductor layer (sometimes referred to as the active region) as shown in FIGS. 1A, 1B and 2A and 2B.

SUMMARY

In accordance with the present disclosure, a Field Effect Transistor (FET) is provided having: a first electrode structure, a second electrode structure; a gate electrode structure disposed laterally along a surface of a semiconductor for controlling a flow of carriers between the first electrode structure and the second electrode structure; and a field plate structure: having one end connected to the first electrode structure and having a second end disposed between the gate electrode structure and the second electrode structure, the second end being separated from the second electrode structure by a gap. A dielectric structure is disposed over the semiconductor, having: a first portion disposed under the second end of the field plate structure; and, a second, thinner portion under the gap.

In one embodiment, the first electrode structure is as source electrode structure and the second electrode structure is a drain electrode structure.

In one embodiment, the Field Effect Transistor (FET) includes a second gap in a third portion of the dielectric structure, the second gap being disposed between the first electrode structure and the gate electrode structure; and, wherein third portion of the dielectric structure is thinner under the second gap than the first portion of the dielectric structure.

In one embodiment, the first portion of the dielectric structure includes: a bottom layer; an intermediate layer disposed on the bottom layer; and an upper layer disposed on the intermediate layer. The second portion of the dielectric layer comprises an extended portion of the bottom layer. The upper layer and the bottom layer are of the same material. The intermediate layer is a material different from the upper layer and the bottom layer.

In one embodiment, the intermediate layer is an etch stop layer.

In one embodiment, the bottom layer and the upper layer have an etch rate to a predetermined etchant at least an order of magnitude greater than the etch rate of the intermediate layer.

In one embodiment, the intermediate layer has a etch rate faster that the etch rate of the bottom layer to an etchant different from the above-mentioned predetermined etchant.

In one embodiment, the intermediate layer is in direct contact with the bottom layer and the upper layer is in direct contact with the intermediate layer and the bottom layer and upper layer are of the same material.

In one embodiment, a method is provided for forming a Field Effect Transistor (FET). The method includes: providing a structure comprising: a first electrode structure; a second electrode structure; a gate electrode structure disposed on a surface of a semiconductor for controlling a flow of carriers between the first electrode structure and the second electrode structure; and a field plate structure connected to the first, and disposed over a region between the first electrode structure and the gate electrode structure; and a dielectric structure extending laterally over the surface of the semiconductor between the first electrode structure and the second electrode structure, the dielectric structure comprising: a bottom layer; an intermediate layer disposed in direct contact with the bottom layer; and an upper layer disposed in direct contact with the intermediate, etch stop, layer wherein the bottom layer and upper layer are of the same material; applying a first etchant to a portion of the dielectric structure disposed between an edge of the field plate structure and the second electrode structure, such first etchant removing the upper layer and stopping at an exposed portion of the etch stop layer producing a gap between the outer edged of the field plate structure and the second electrode structure.

In one embodiment, the method includes applying a second etchant, different from the first etchant to the exposed portion of the etch stop layer, such etchant removing the etch stop layer and stopping at the bottom layer.

With such an arrangement, a FET with a SCFP structure is provided having lower dielectric loading and reduced parasitic capacitance and thereby provides higher efficiency under high voltage operation.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
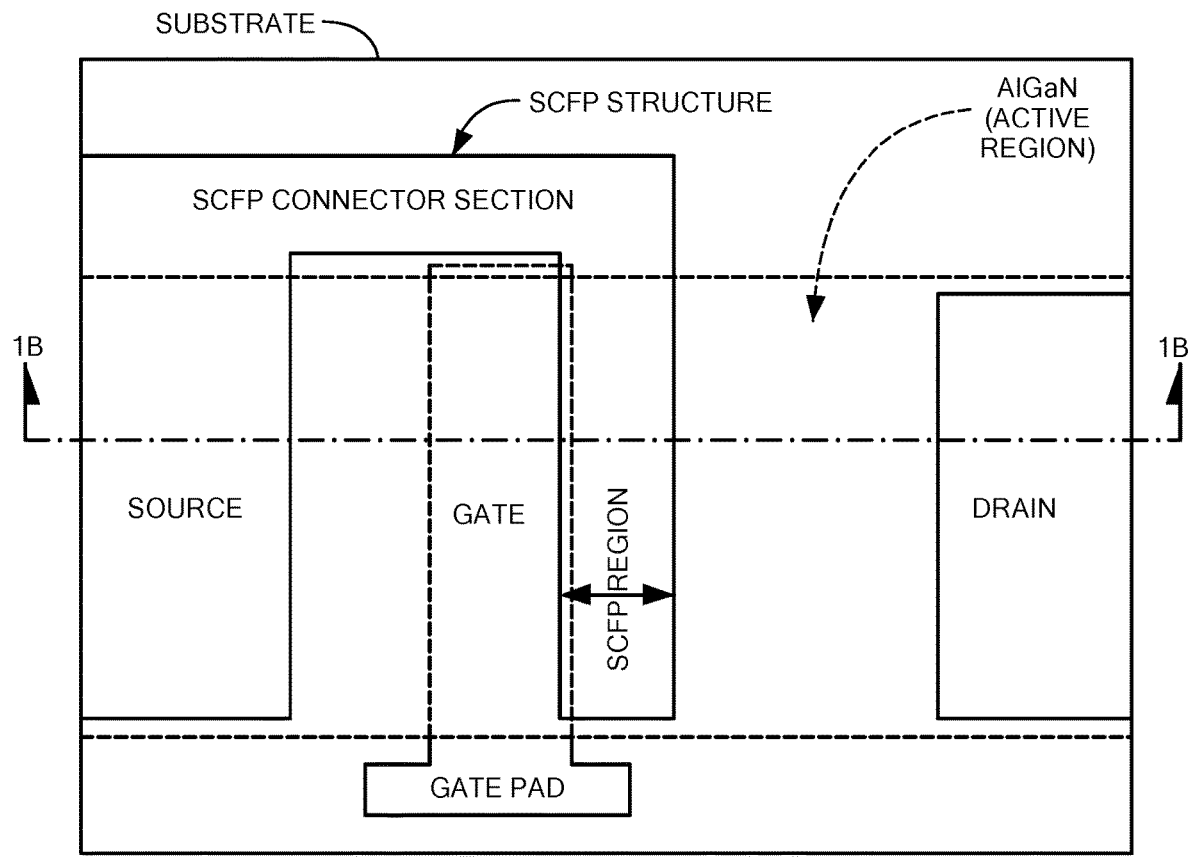
FIGS. 1A and 1B simplified, diagrammatical plan and cross sectional sketches of one type of Source Connected Field Plate Field Effect Transistor according to the PRIOR ART.
Figure 1B:
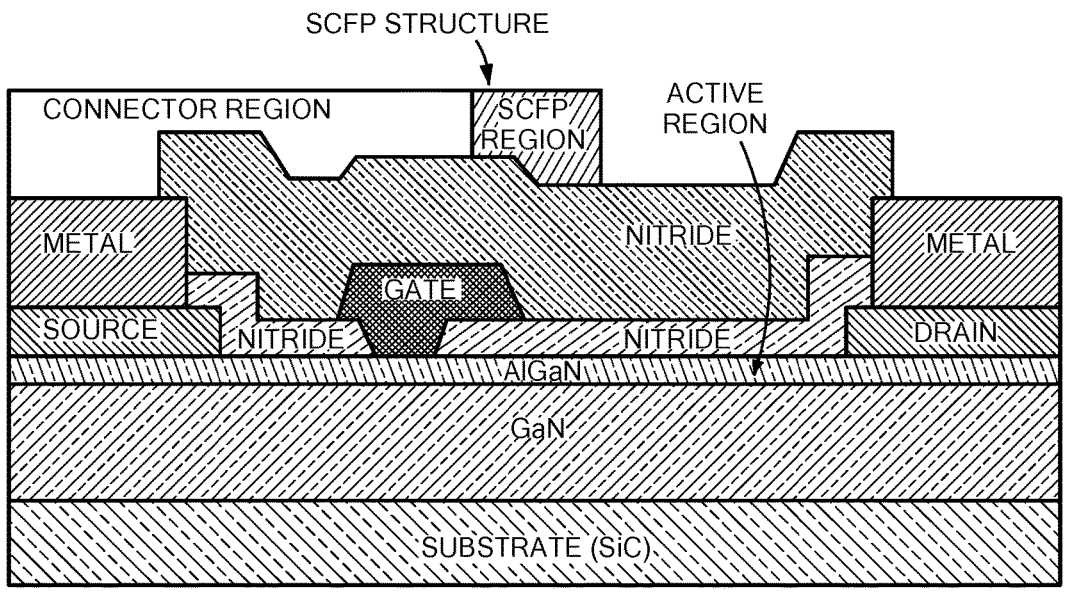
Figure 2A:
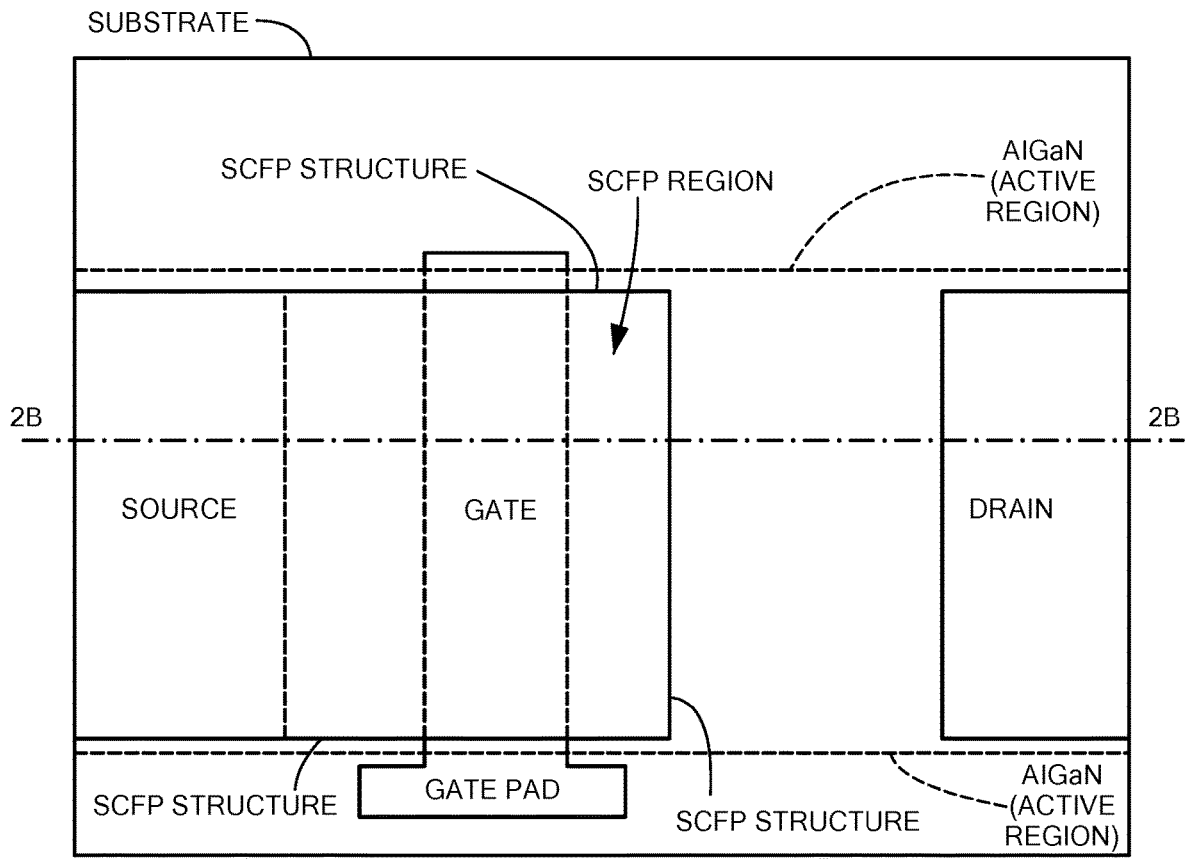
FIGS. 2A and 2B are simplified, diagrammatical plan and cross section sketches of a type of Source Connected Field Plate Field Effect Transistor according to the PRIOR ART.
Figure 2B:
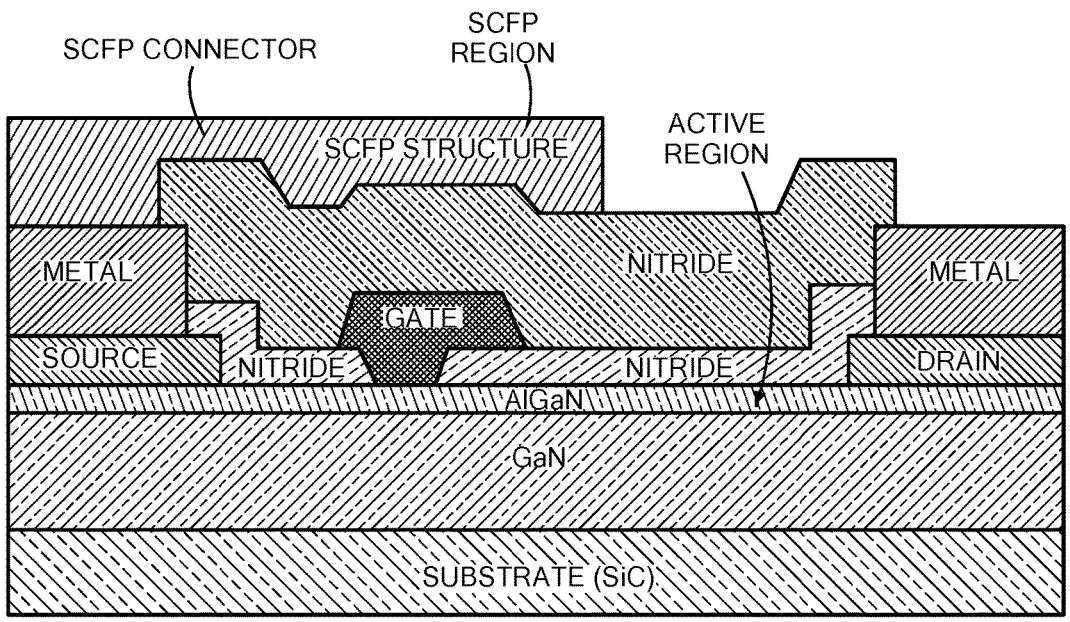
Figure 3A:
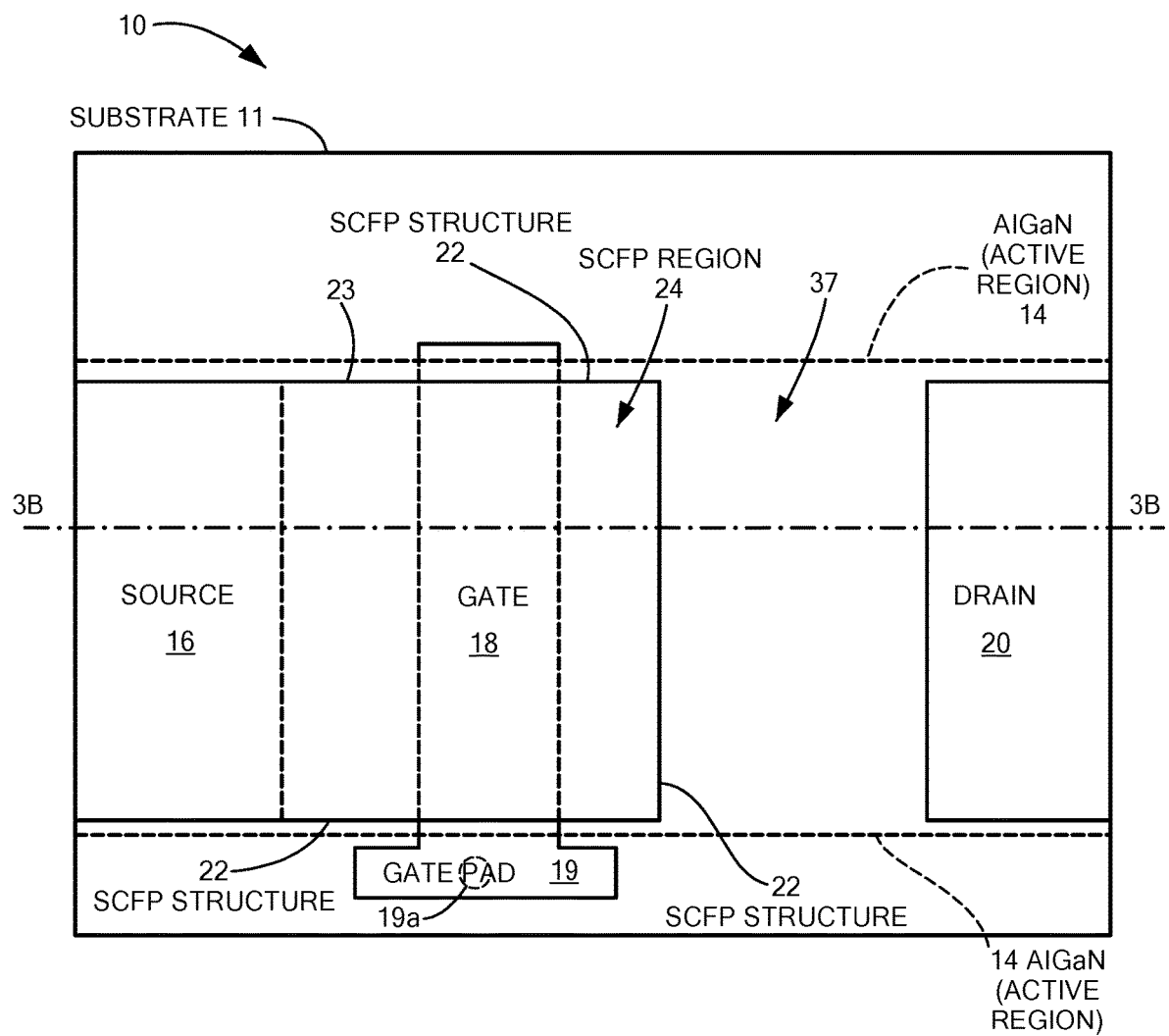
FIG. 3A is a simplified, diagrammatical plan view sketch of a Source Connected Field Plate Field Effect Transistor according to the disclosure.
Figure 3B:
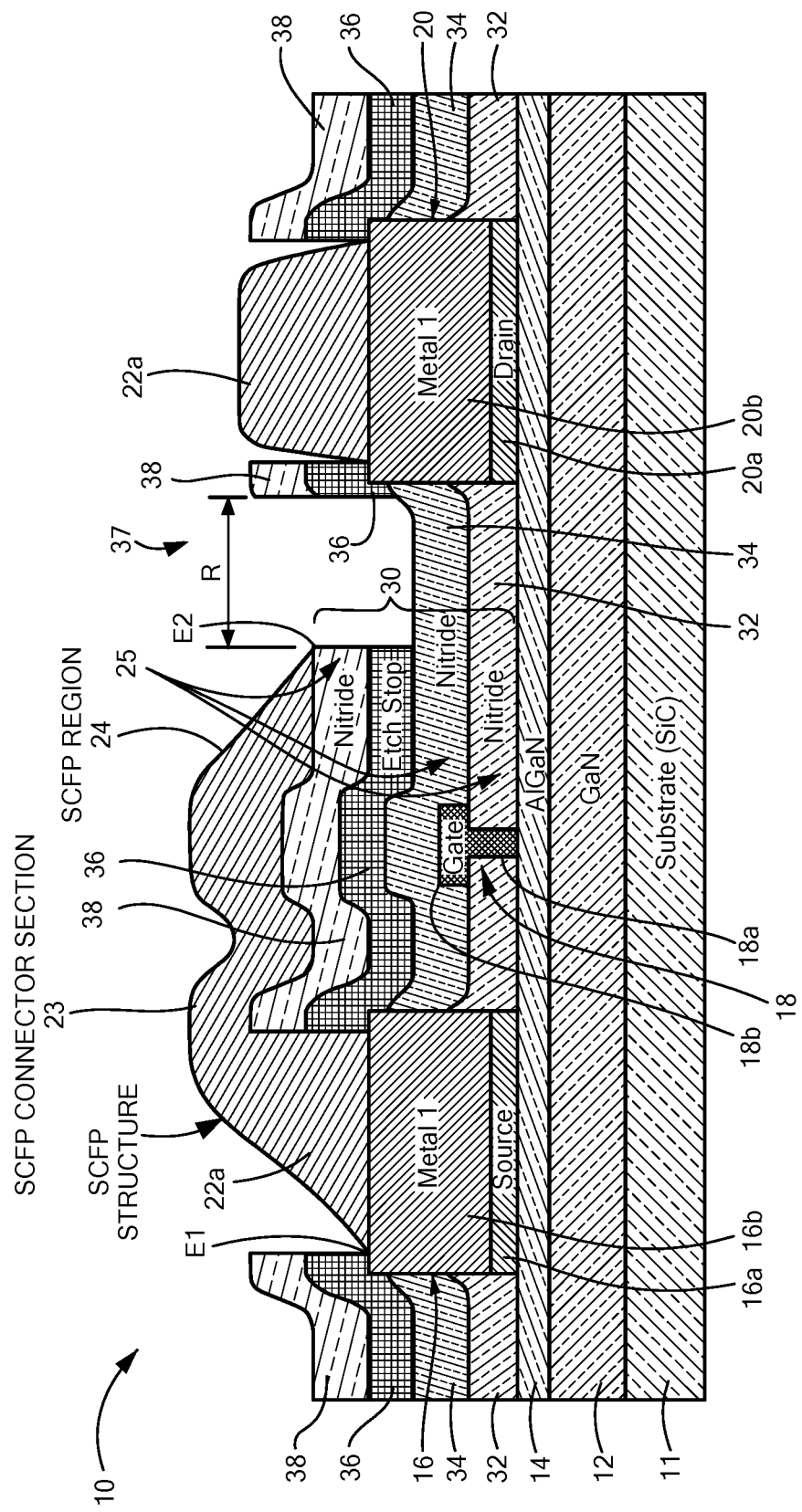
FIG. 3B is a simplified, diagrammatical cross sectional sketch of the Source Connected Field Plate Field Effect Transistor of FIG. 3A, such cross section being taken along line 3B-3B of FIG. 3A.

Referring now to FIGS. 3A and 3B, a Source Connected Field Plate (SCFP) Field Effect Transistor (FET) 10 is shown having substrate 11, here for example Silicon Carbide, having a Gallium Nitride (GaN) buffer layer 12 with a semiconductor layer 14 (the active region), here, for example, Aluminum Gallium Nitride (AlGaN) mesa on an upper surface of the substrate 11. It should be understood that other materials may be used for the substrate 11. Source, gate, and drain electrode structures 16, 18 and 20, respectively, are disposed on a surface of the semiconductor layer 14, as shown. The source and drain electrode structures 16 and 20, have lower portions 16a and 20a, respectively, in ohmic contact with the semiconductor layer 14 and upper interconnect layers 16b, 20b, respectively on the lower portions 16a and 20a, respectively, as shown. The gate electrode structure 18 has a lower portion 18a in Schottky contact with the semiconductor layer 14 and an upper portion 18b shaped to form a T-shaped or gamma-shaped gate electrode structure 18. The gate electrode controls the flow of carriers between the source electrode structure 16 and the drain electrode structure 20. The gate electrode 18 is connected to a gate pad 19, through a conductive via 19a as shown, such via 19a being formed with upper interconnect layers 16b, 20b.

A field plate structure 22, here a source connected field plate (SCFP) structure, is electrically connected to the source electrode structure 16 through a SCFP connector section 23 and extends has over a portion of the gate electrode structure 18 of the FET 10 as shown. The field plate structure 22, has an outer SCFP region portion (sometimes also referred to herein as a field plate region) 24 disposed over a region 25 of the semiconductor 14 between the gate electrode structure 18 and the drain electrode structure 20 to provide a SCFP region 24, as shown.

A dielectric structure 30 has: a pair of lower dielectric layers 32, 34, here for example, silicon nitride, extending laterally over the surface of the semiconductor 14 between the source electrode structure 16 and the drain electrode structure 20; an etch stop layer 36, here for example aluminum oxide ($Al_2O_3$) disposed over layer 34. It should be understood that other materials may be used for layers 32, 34 and 36. For example, layers 32 and 34 may be aluminum oxide ($Al_2O_3$) in which case etch stop layer 36 may be, for example, silicon dioxide ($SiO_2$). The etch stop layer 36 has a gap 37 therein over the region R, as shown in FIG. 3B. An upper dielectric layer 38, here the same material as used for dielectrics layer 32, 34 is disposed over the etch stop layer 36, having the gap 37 therein, as shown. It is noted that the same metal 22a used to form the field plate structure 22 is disposed on the upper portion of the source electrode structure 16 and the upper portion of the drain electrode structure 20; however while a portion of the metal 22a is disposed on and hence connected to the source electrode structure 16, (thereby connecting the SCFP structure 22 to the source electrode structure 16), the portion of metal 22a on the drain electrode structure 20 is electrically isolated from the portion of the metal on the source electrode structure 16 by the gap 37. It is noted that the SCFP structure 22 has the SCFP connector section, such section 23 having, as noted above one end E1 connected to the source electrode structure 16 and a second end E2 connected to the SCFP region 24; the SCFP region 24 being over a region between the gate electrode structure 18 and the drain electrode structure 20 but separated or spaced from the drain electrode structure 20 by a gap provide by the region, R, as shown in FIG. 3B.

Figure 4A:
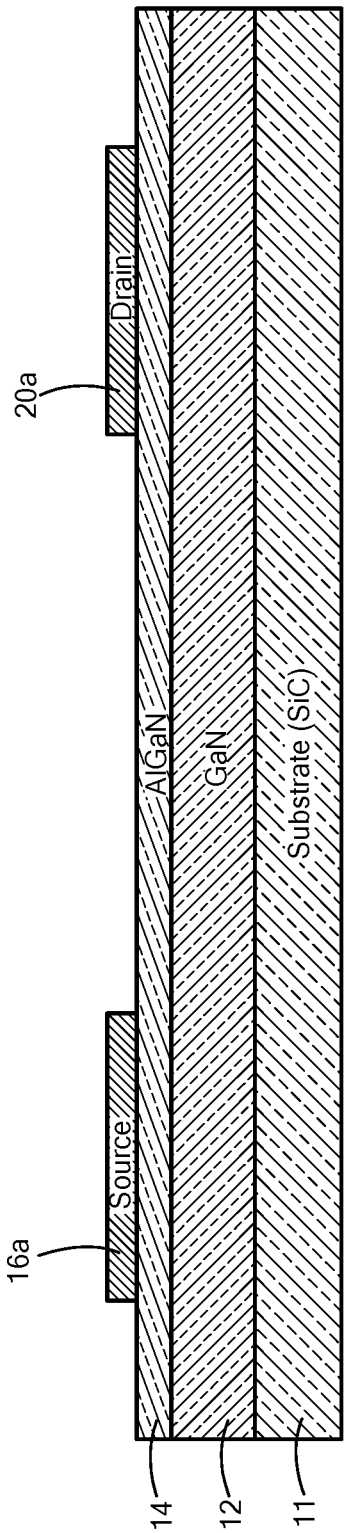
FIGS. 4A-4N are simplified, diagrammatical cross sectional sketches of the Source Connected. Field Plate Field Effect Transistor of FIGS. 3A and 3B at various stages in the fabrication thereof according to the disclosure.
Figure 4B:
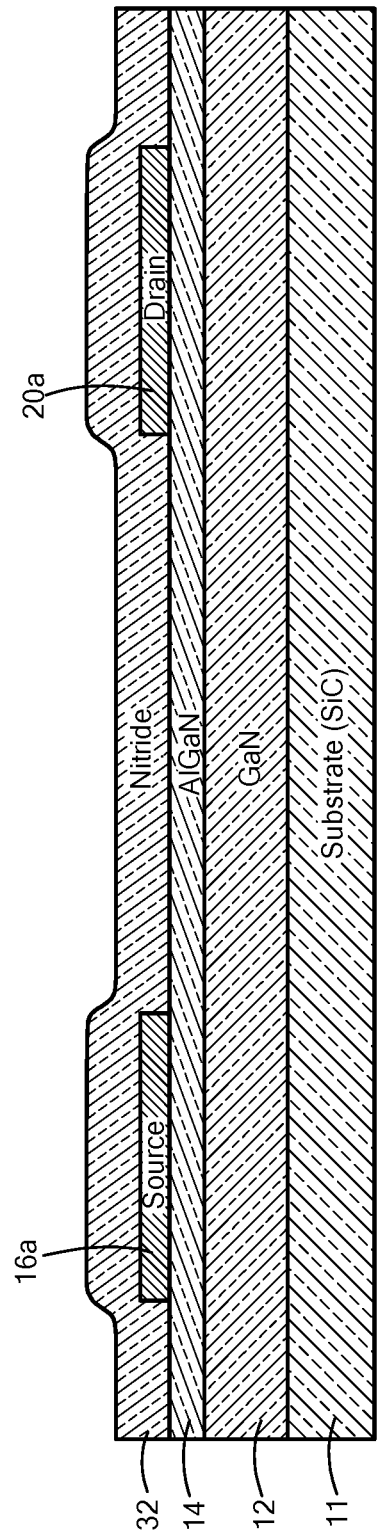
FIGS. 4J', 4K' and 4L' are simplified, diagrammatical cross sectional sketches of the Source Connected Field Plate Field Effect Transistor of FIGS. 3A and 3B at various stages in the fabrication thereof according to another embodiment of the disclosure
Figure 4C:
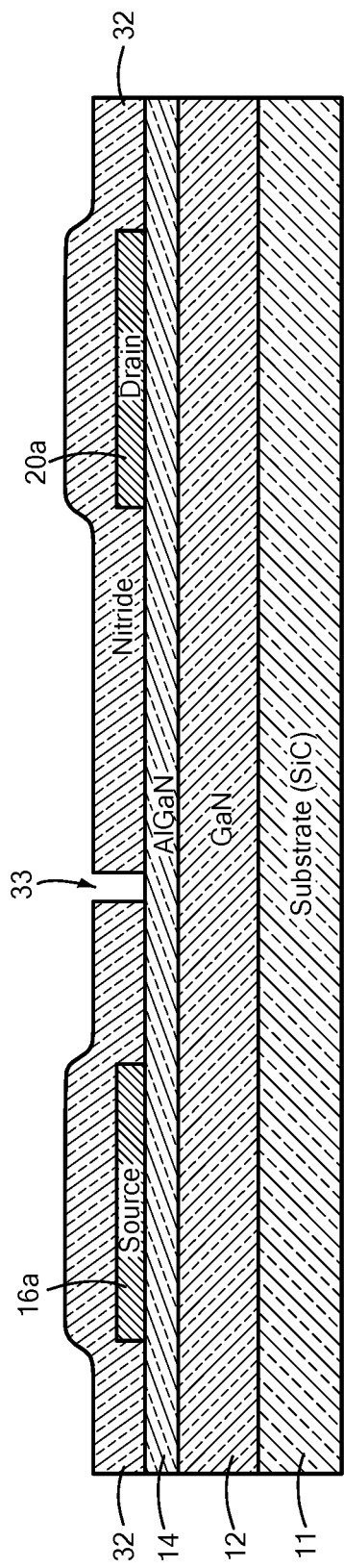
Figure 4D:
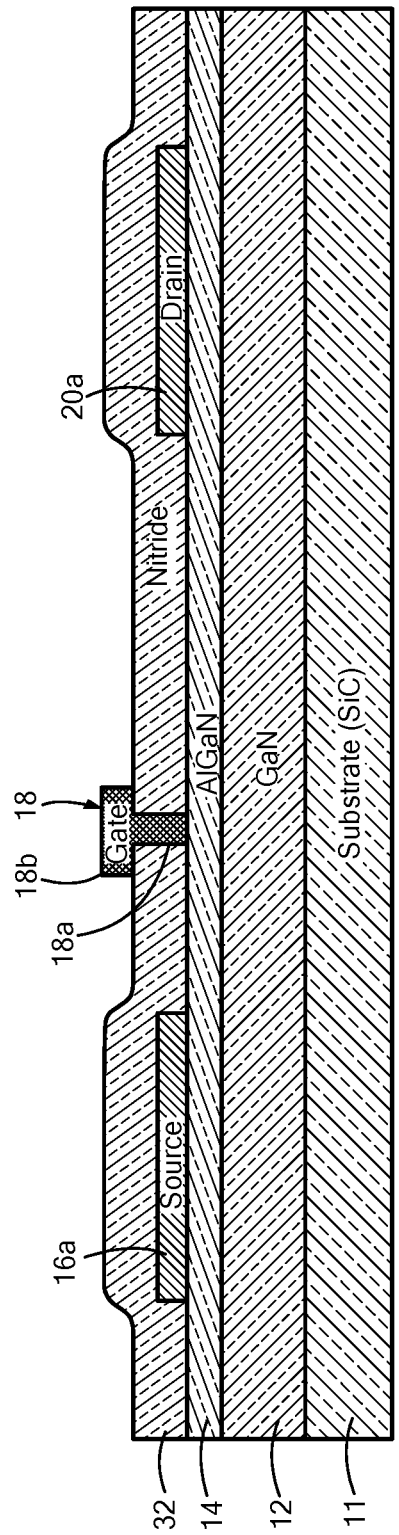
Figure 4E:
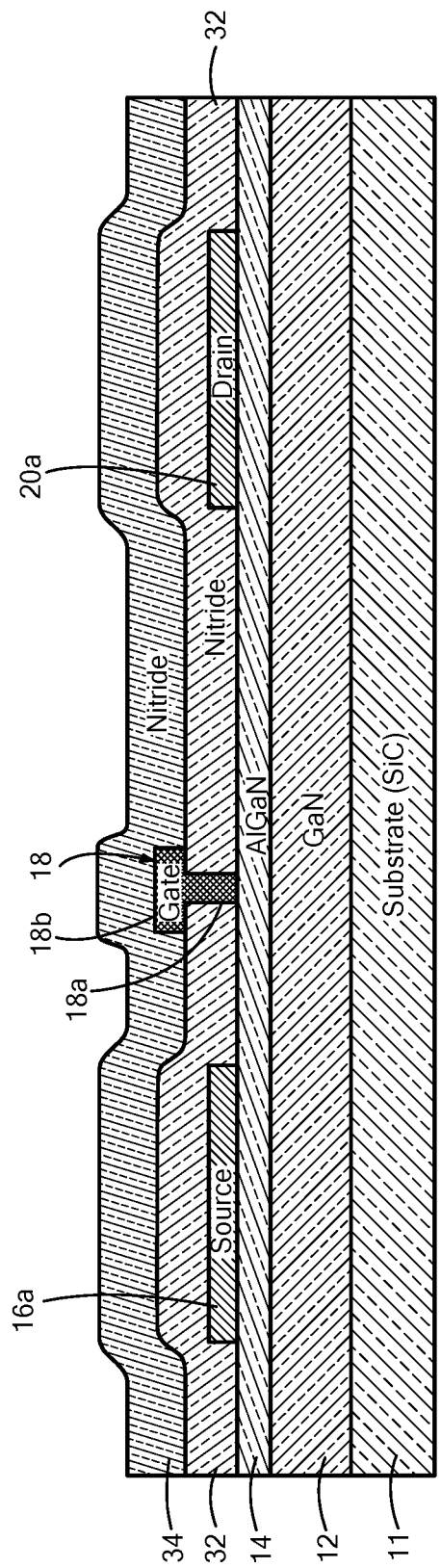
Figure 4F:
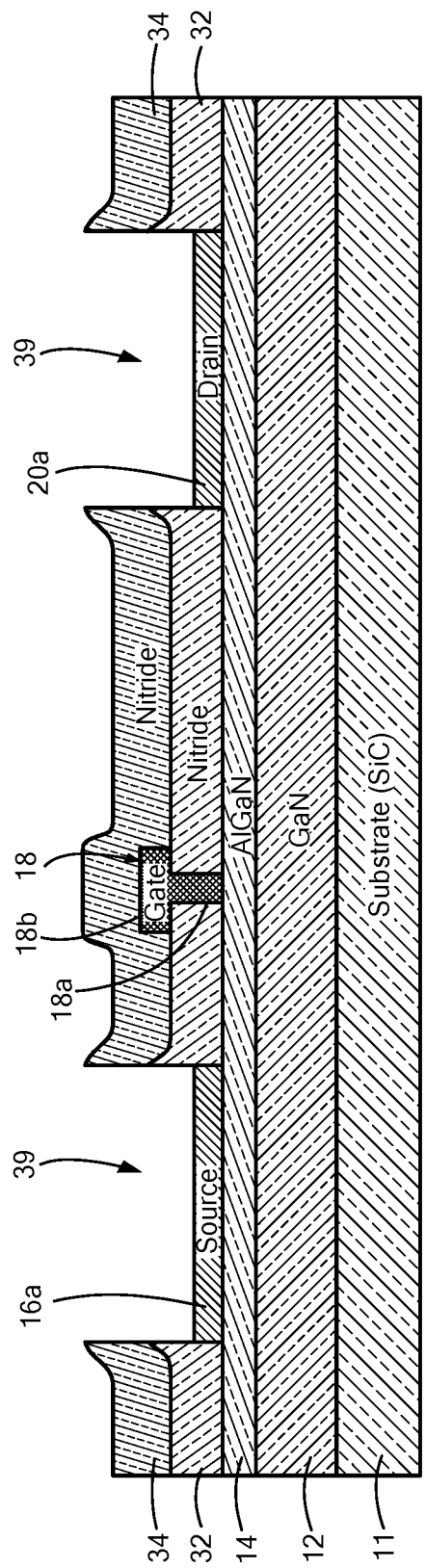
Figure 4I:
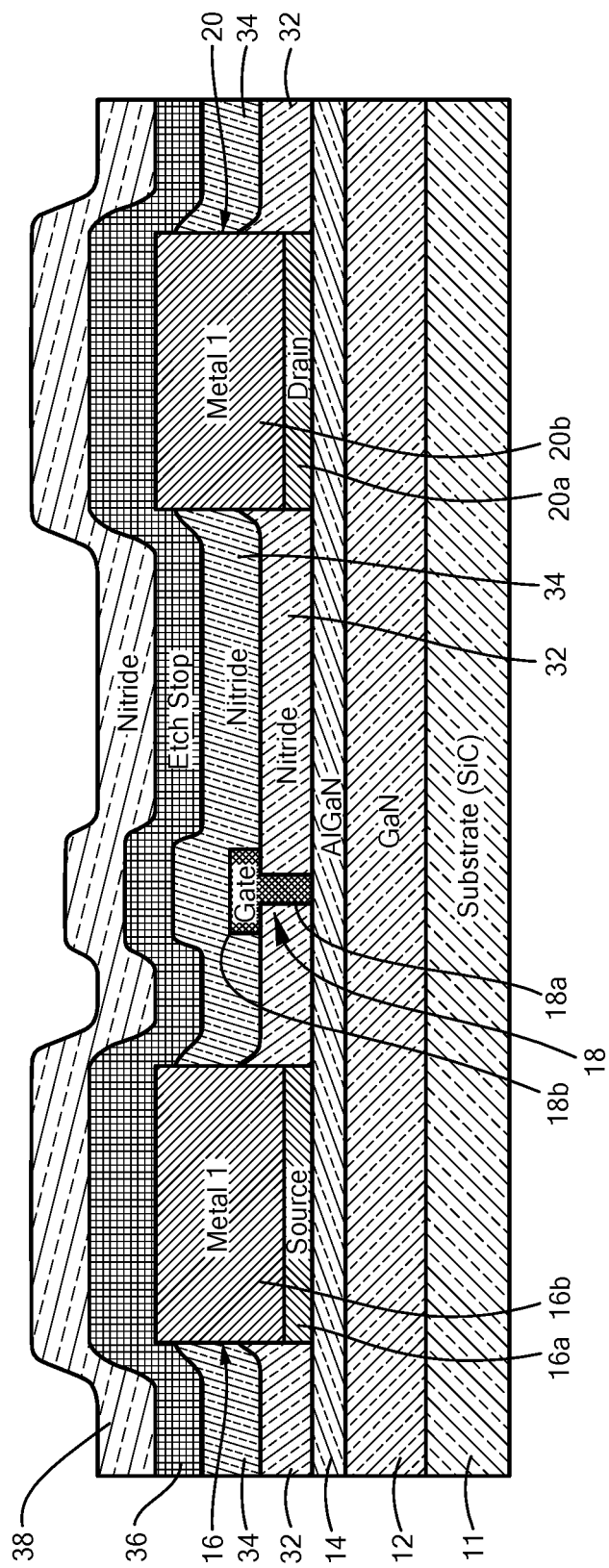
Figure 4J:
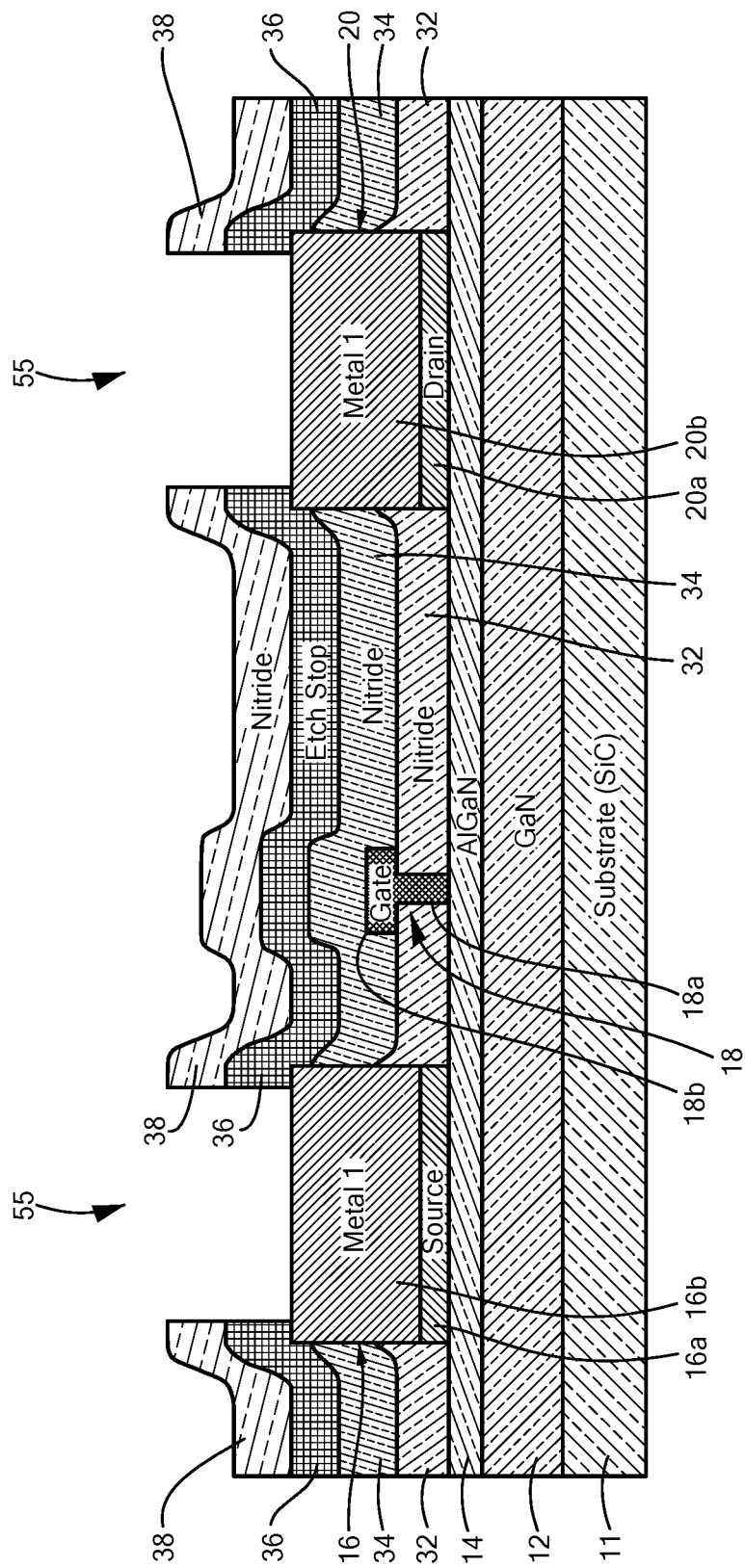
Figure 4K:
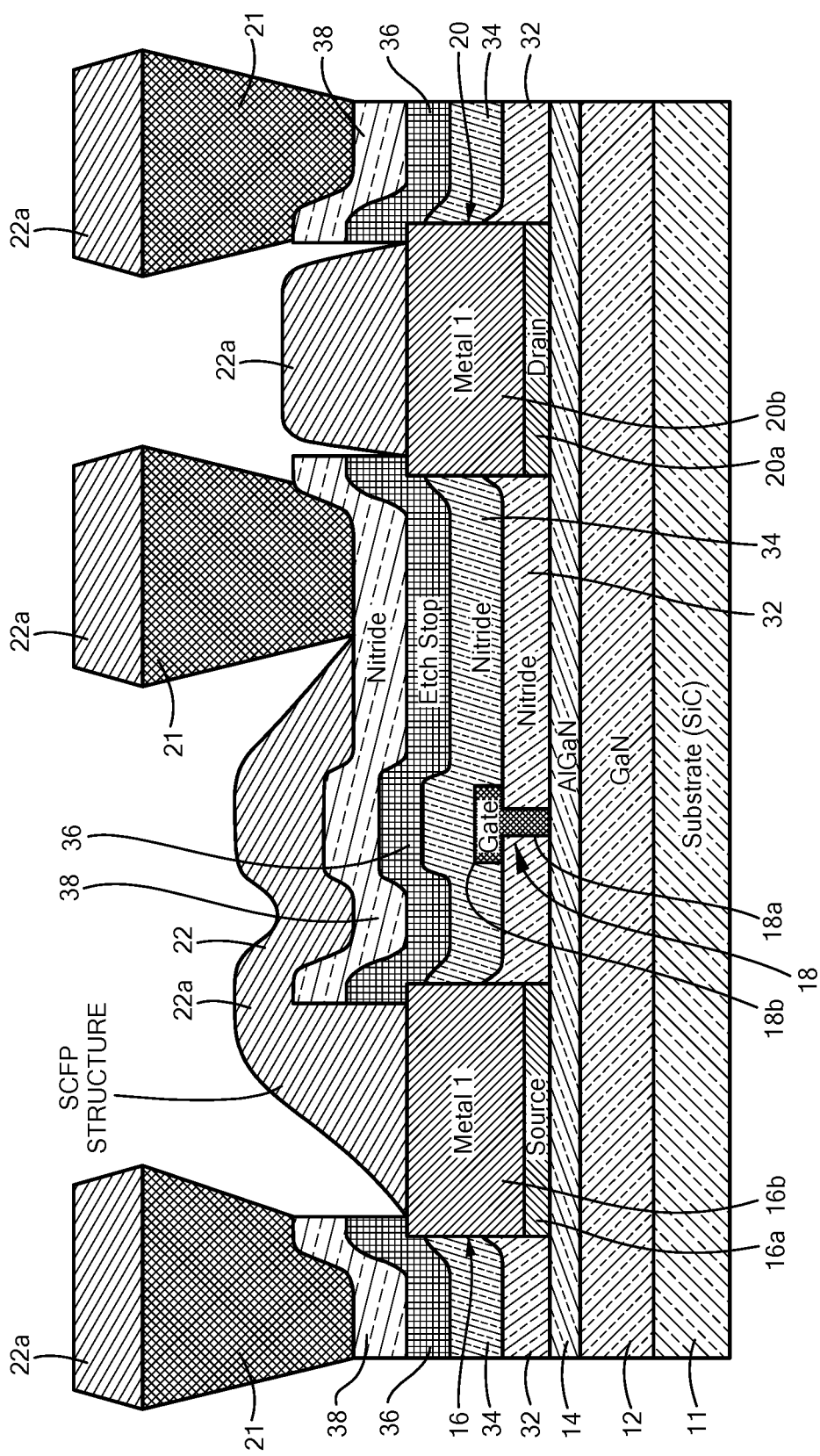
Figure 4K:
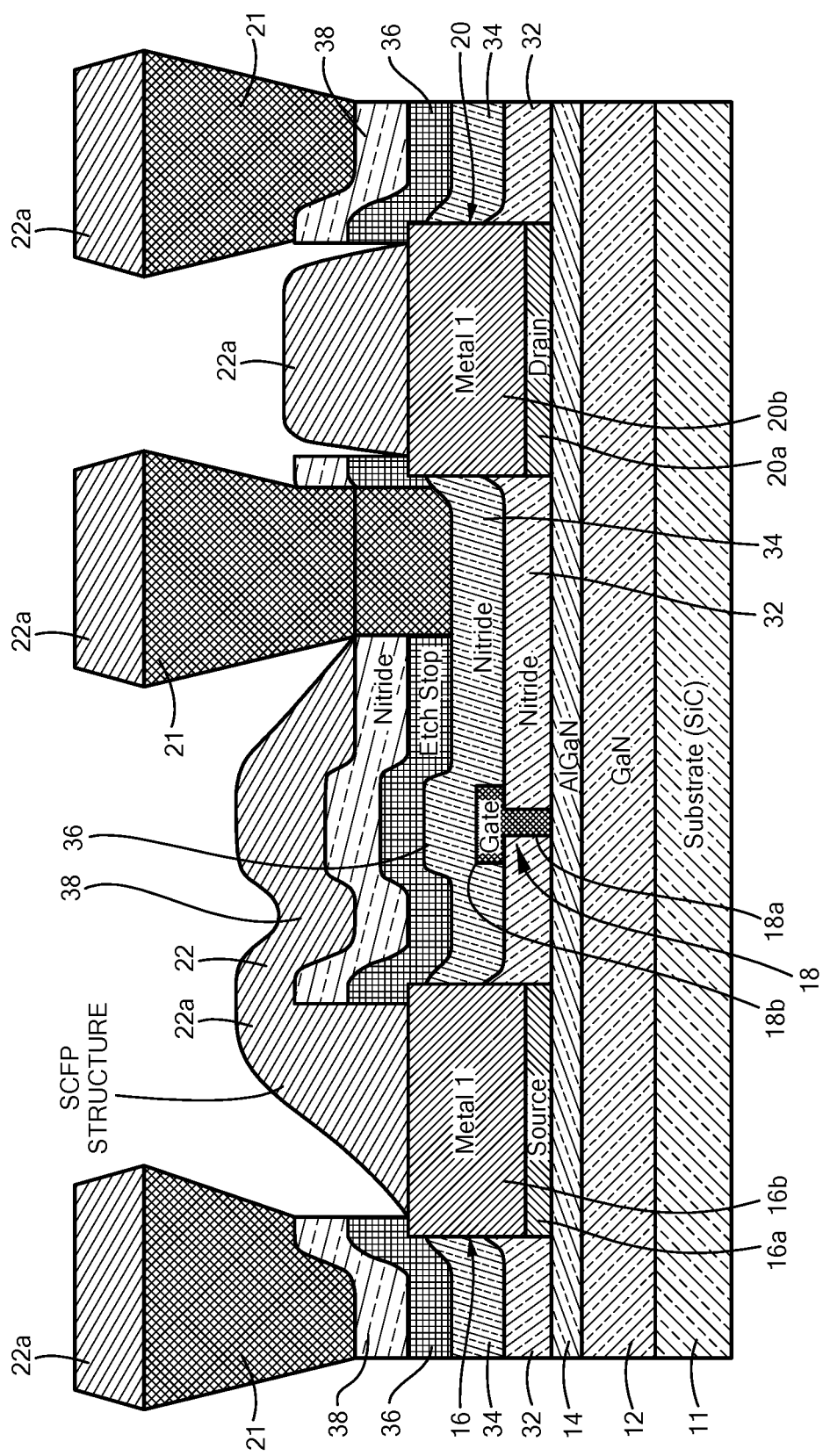
Figure 4L:
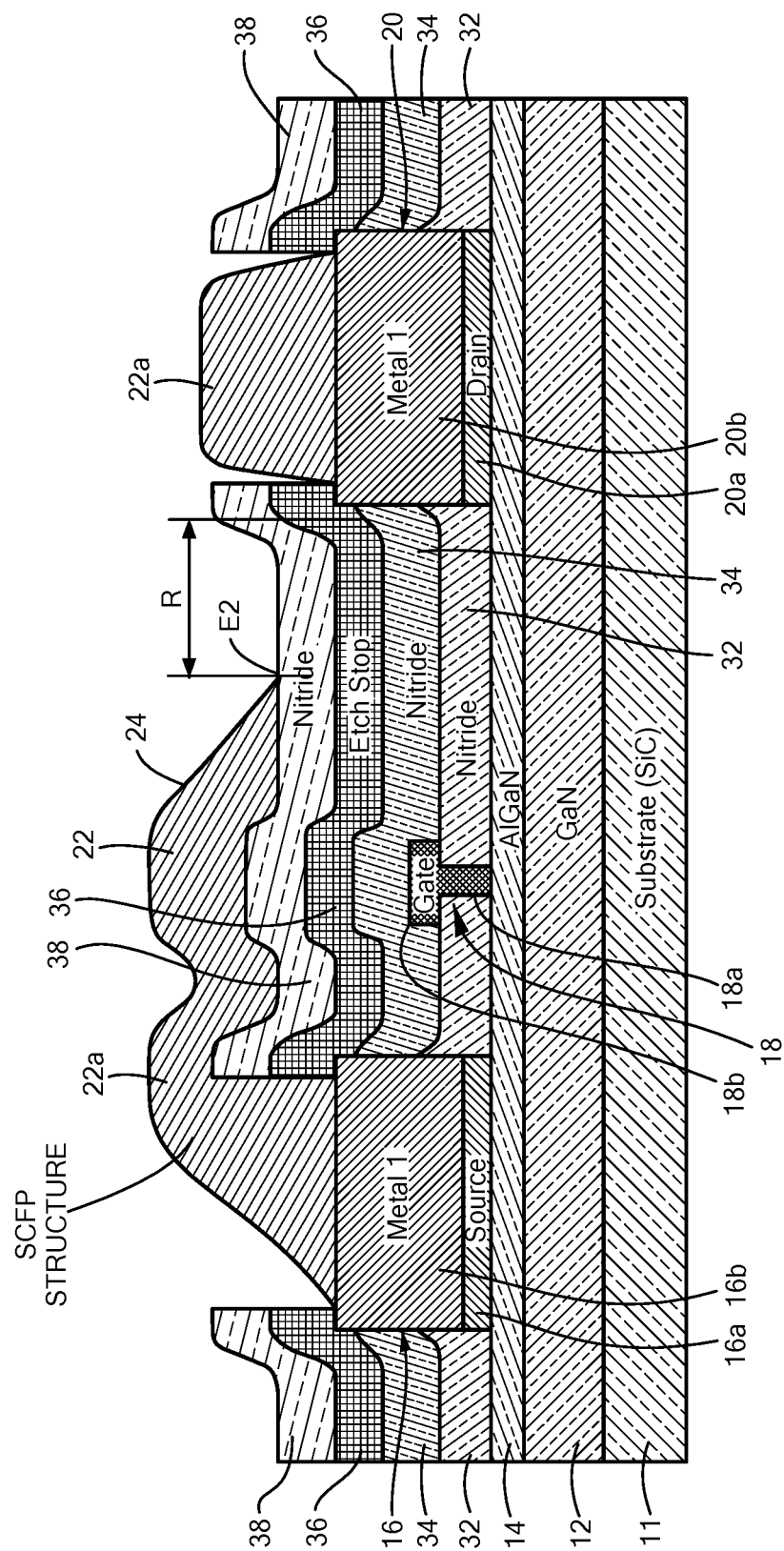
Figure 4L:
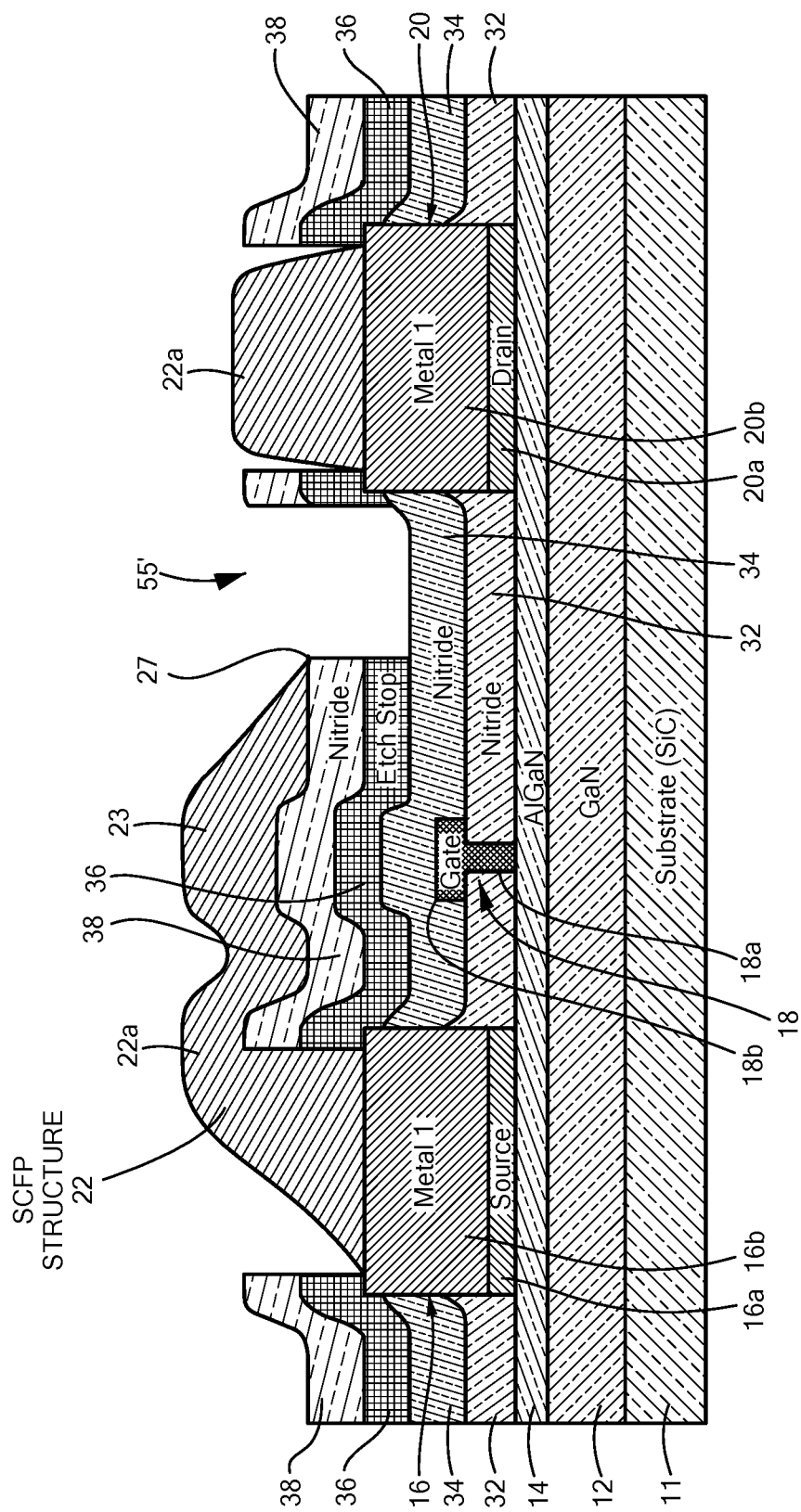
Figure 4M:
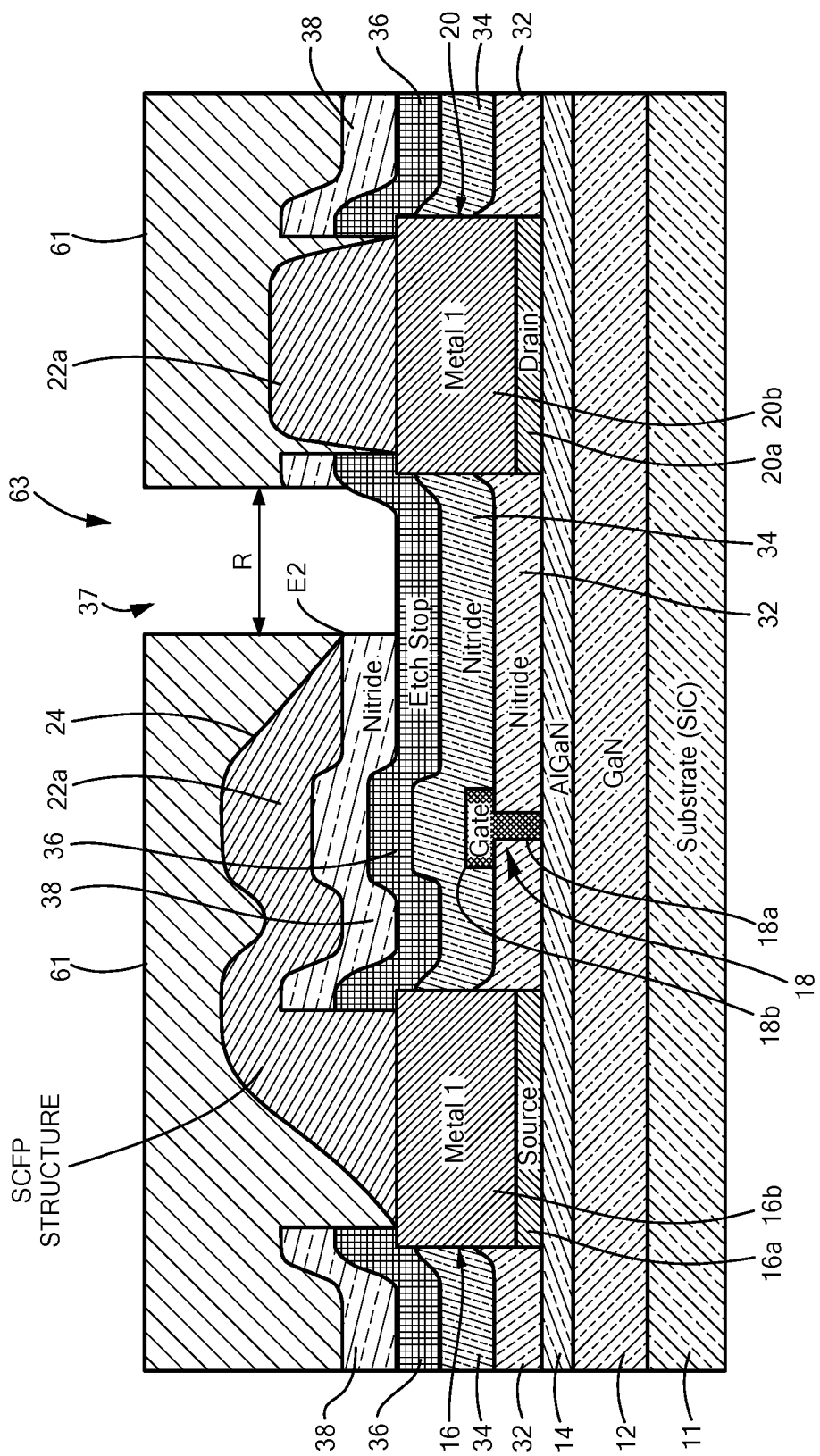
Figure 4N:
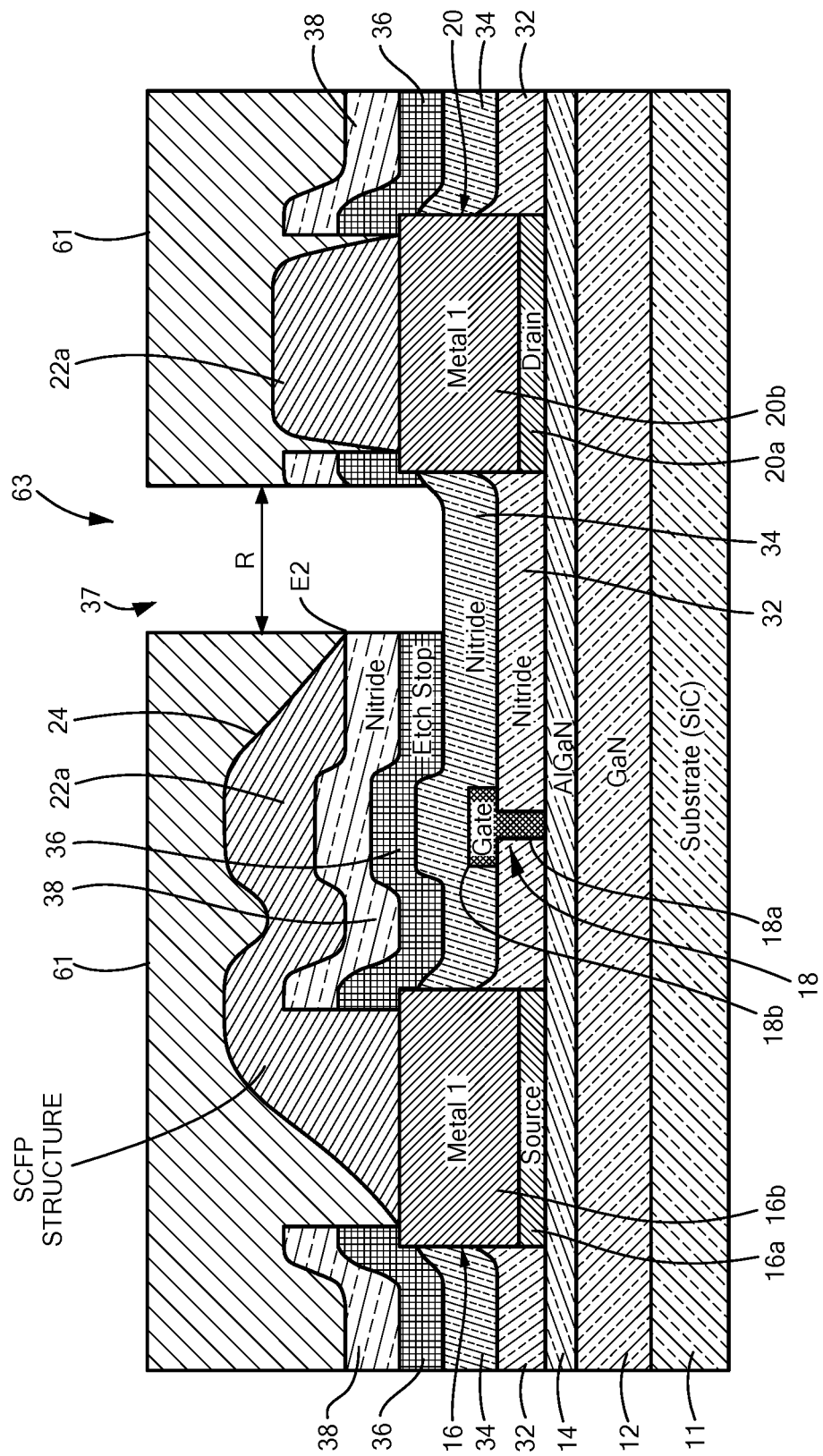

Referring now to FIGS. 4A-4N the process for forming the Source Connected Field Plate Field. Effect Transistor 10 of FIGS. 3M and 3B will be described. Referring to FIG. 4A, a structure is provided having the substrate 11, semiconductor layers 12 and 14, and the lower portion 16a, 20a of the source and drain electrode structures 16, 20 formed thereon using any conventional process.

Referring to FIG. 4B, the dielectric layer 32 is deposited with uniform thickness over the lower portions 16a, 20a of the source and drain electrode structures 16, 20 as shown in FIG. 3B.

Referring now to FIG. 4C, an opening 33 is formed through a portion of the layer 32 where the gate electrode structure 18 is to be formed using any conventional lithographic-etching process.

Referring to FIG. 4D, a layer of Schottky contact metal, here for example a stack of nickel, then platinum then gold (Ni/Pt/Au) is deposited with uniform thickness over the surface of the structure shown in FIG. 4C with a portion of such metal passing through the opening 33 onto the exposed portion of the semiconductor layer 14. The structure is then processed in any conventional manner to form a Schottky contact with the Schottky contact metal and the semiconductor 14 to thereby form the gate electrode structure 18.

Residual portions of the Schottky contact metal are removed using any process, such as a lift-off process.

Referring to FIG. 4E, the dielectric layer 34 is formed with uniform thickness over the structure, as shown.

Referring now to FIG. 4F, apertures 39 are formed through dielectric layers 32 and 34 over the lower portions 16a, 20a of the source and drain electrodes structures 16, 20, as shown.

Referring now to FIG. 4G, the upper portions of the source and drain electrodes 16b and 20b respectively are formed as shown using any conventional process.

Referring now to FIG. 4H, the dielectric etch stop layer 36 is deposited with uniform thickness over the structure as shown. In the case where layers 32 and 34 are silicon nitride, the etch stop layer 36 is aluminum oxide ($Al_2O_3$) and for the case where layers 32 and 34 are aluminum oxide ($Al_2O_3$), the etch stop layer 36 is silicon dioxide ($SiO2$).

Referring to FIG. 4I, the dielectric layer 38 is deposited with uniform thickness over the etch stop layer 36, as shown. In the case where the etch stop layer 36 is aluminum oxide, dielectric layer 38 is, for example, silicon nitride and in the case where the etch stop layer 36 is silicon dioxide, the dielectric layer 38 would be, for example, aluminum oxide.

Referring now to FIG. 4J, apertures 55 are formed through layers 38 and 36 using photolithographic-etching processing. In the case where layers 32 and 34 are silicon nitride and the etch stop layer 36 is aluminum oxide ($Al_2O_3$), the etchant for layers 32 and 34 is, for example, a fluorine based etchant for etching the silicon nitride layers 32 and 34, such etching stopping at the aluminum oxide layer 36 and for the case where layers 32 and 34 are aluminum oxide ($Al_2O_3$) and the etch stop layer 36 is silicon dioxide (SiO2), the etchant for layers 32 and 34 is for example, a chorine based etchant or ammonia hydroxide, such etching stopping at the silicon dioxide etch stop layer 36. Thus, in either case, the etch stop layer 36 acts as an etch stop because it etches at a rate at least an order of magnitude slower than the etchant used for etching layers 32 and 34. It should be noted that here the upper portions 16b, 20b of the source and drain electrode structures 16, 20 is, for example a tri-metal layer of titanium, then platinum, then gold (Ti/Pt/Au) or a hi-metal layer of Ti/Au so that the upper portions 16b, 20b of the source and drain electrode structures 16, 18 serve as an etch stop layer in this process step, thereby exposing the upper portions 16b, 20b of the source and drain electrode structures 16, 20.

Referring now to 4K, a photoresist layer 21 is patterned over the surface of the structure, exposing regions of the surface of the structure where the metal layer 22a is to be formed on the upper portion of the source electrode structure 16 and drain electrode structure 20 and where the field plate structure 22 is to be formed. Thus, the layer 22a is deposited using, for example, electron-beam evaporation, over the photoresist 21 and onto portions of the structure exposed by the photoresist 21 layer, as shown.

Referring again to FIG. 4K, the photoresist 21 is removed thereby forming the structure shown in FIG. 4L using a conventional lift-off process with the gap 37 (FIGS. 4A and 4B) being formed between the outer edge or end E2 of the SCFP region 24 of the field plate structure 22 and the drain electrode 20. It is noted that the upper portion of the field plate structure 22 extends along the surface of the dielectric layer 38 from above the source electrode structure 16 and terminates at the outer edge or end E2 of the SUP region 24. Thus, the field plate structure 22 does not extend above a region R between the gate electrode structure 18 and the drain electrode structure 20.

Referring to FIG. 4M, a photoresist mask 61 is formed over the structure with an opening 63 therein over the region R as shown using any conventional process to expose the portion of the dielectric layer 38 in the region R. The exposed portion of layer 38 is selectively etched away. In the case where the layer 38 is silicon nitride and the etch stop layer 36 is Aluminum oxide, the etchant used to remove the dielectric layer 38 is a fluorine based etchant and in the case where layer 38 is aluminum oxide the etchant is a chlorine based etchant or ammonia hydroxide.

Next the etch stop layer 36 is selectively removed, as shown in FIG. 4N, (here using a chlorine or ammonium hydroxide based etchant for the an aluminum oxide etch stop layer 36 in the case where layer 38 is silicon nitride or using a fluorine based etchant in the case where the etch stop layer 38 is silicon dioxide and layer 38 is aluminum oxide) below the region R (FIG. 4M); it being noted that the etch rate of the aluminum oxide etch stop layer 36 is much slower to the chlorine or ammonium hydroxide based etchant than to a silicon nitride layer 38 and the chlorine or ammonia hydroxide etchant is much slower to the silicon dioxide etch stop layer 36 than to an aluminum oxide layer 38. The mask 61 is then removed completing the Source Connected Field Plate Field Effect Transistor 10 shown in FIGS. 3A and 3B.

Referring now to FIGS. 4J'-4L', an alternative process is described. Here, after forming the structure shown in FIG. 4I, an aperture 55' is formed at the same time apertures 55 are formed, as shown in FIG. 4J'. The photoresist material 21 is here patterned as shown in FIG. 4K' over the surface of the structure as shown in FIG. 4K' exposing regions of the surface of the structure where the metal layer 22a is to be formed on the upper portion of the source electrode structure 16 and drain electrode structure 20, and where the field plate structure 22 is to be formed, as shown in FIG. 4K'. Thus, the layer 22a is deposited over the photoresist 21 and onto portions of the structure exposed by the photoresist 21 layer, as shown. Next, the photoresist layer 21 is removed, as shown in FIG. 4L' completing the Source Connected Field Plate Field Effect Transistor 10 shown in FIGS. 4A and 4B.

Figure 5A:
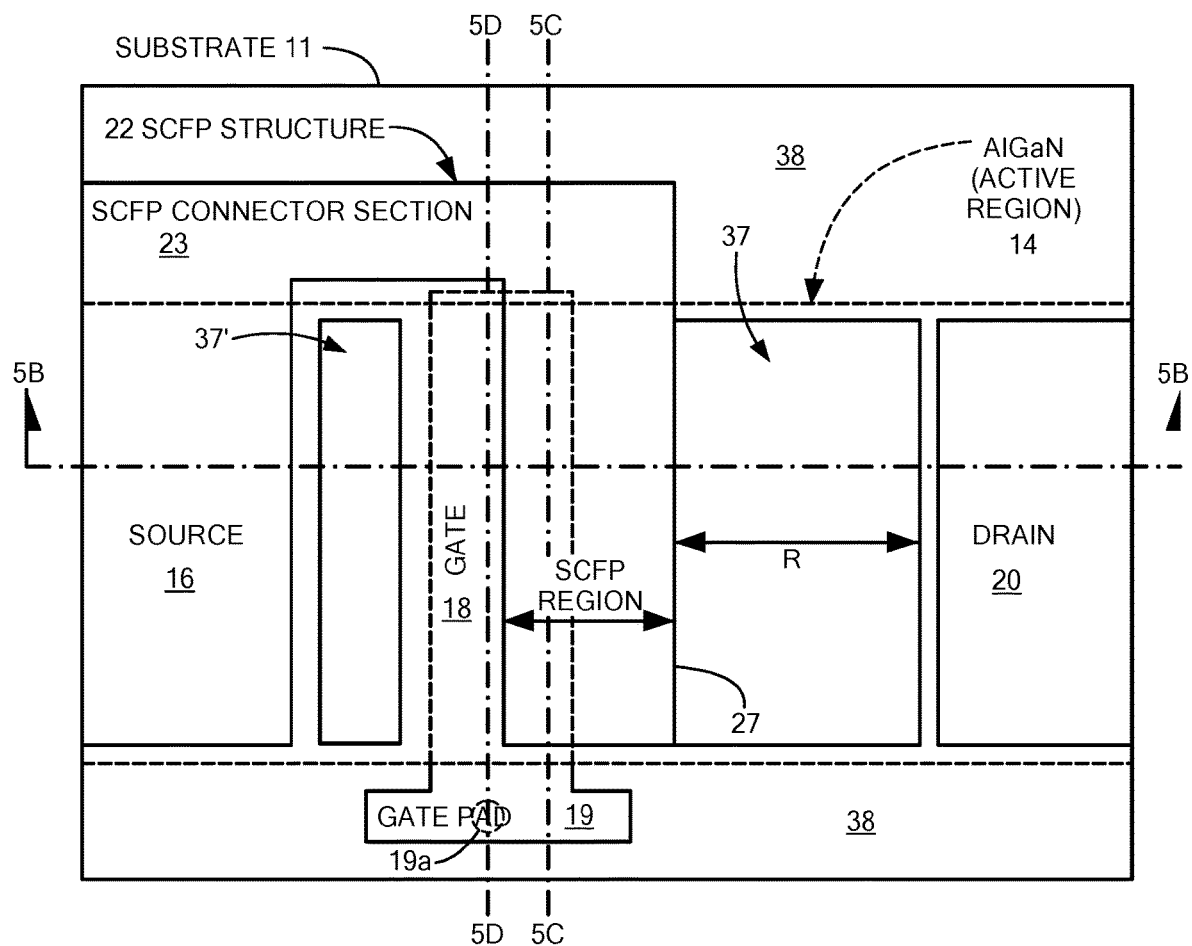
FIG. 5A is a simplified, diagrammatical plan view sketch of another type of Source Connected Field Plate Field Effect Transistor according to the disclosure.
Figure 5B:
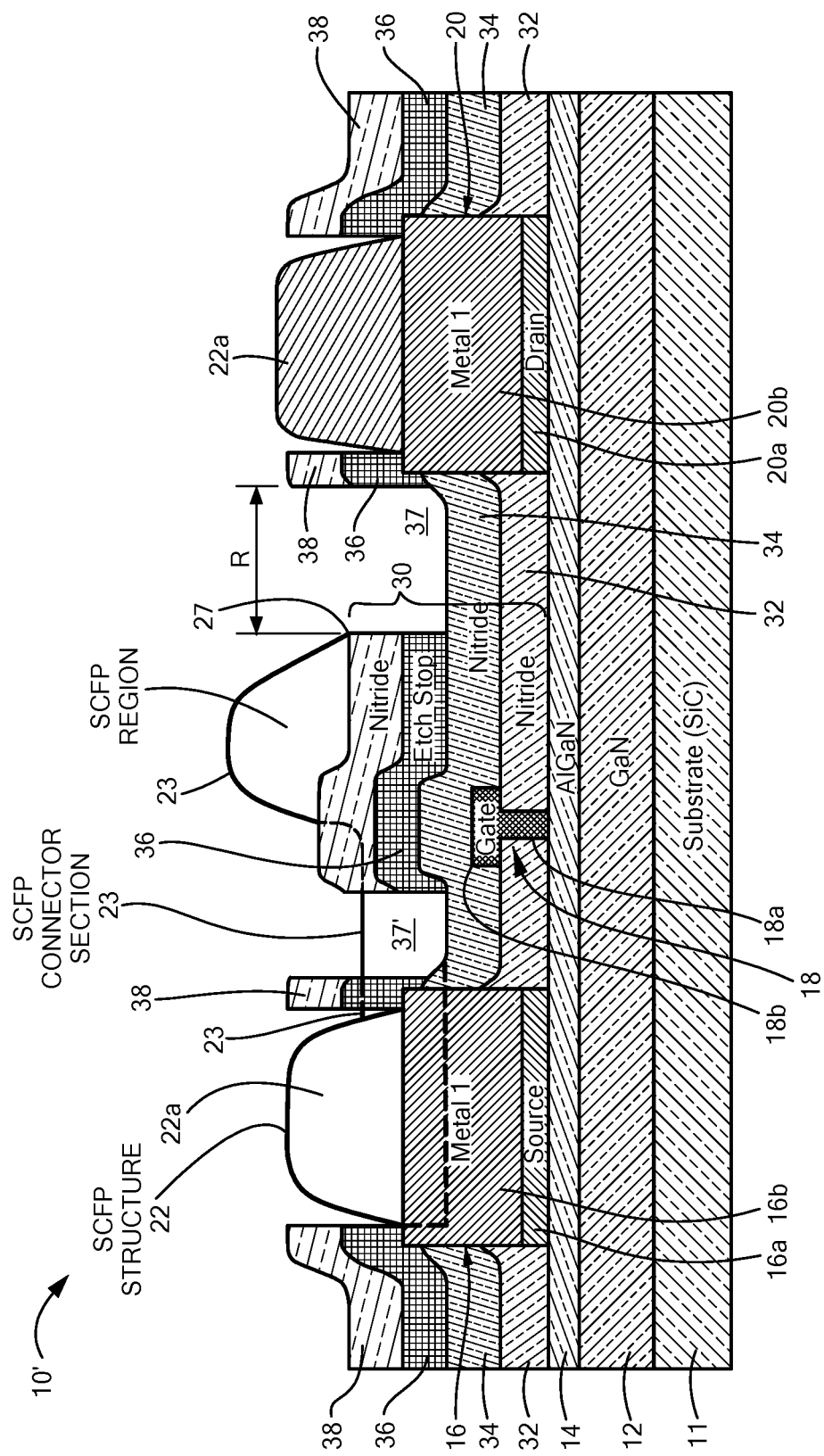
FIG. 5B is a simplified, diagrammatical cross sectional sketch of the Source Connected Field Plate Field Effect Transistor of FIG. 5A, such cross section being taken along line 5B-5B of FIG. 5A.
Figure 5C:
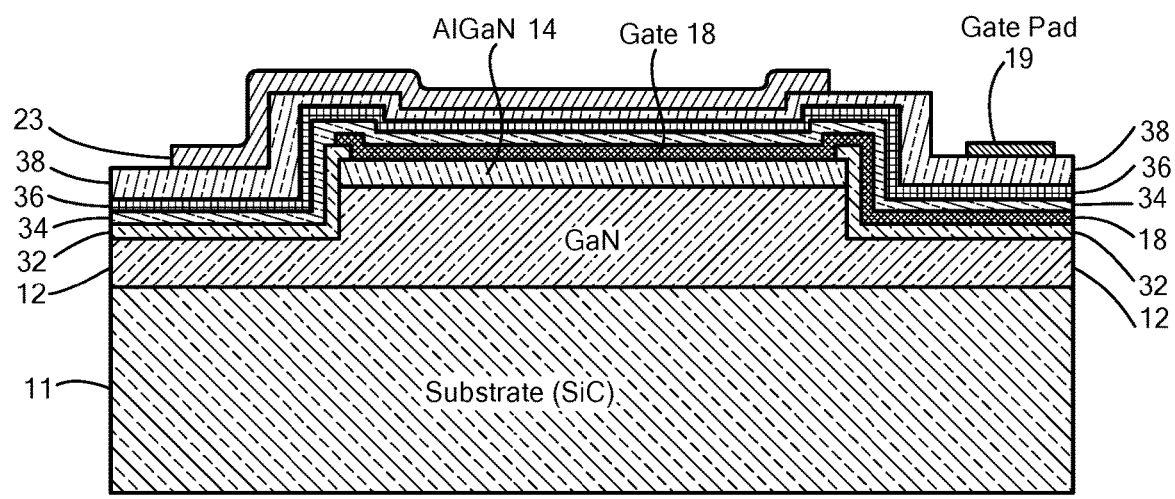
FIG. 5C is a simplified, diagrammatical cross sectional sketch of the Source Connected Field Plate Field Effect Transistor of FIG. 5A, such cross section being taken along line 5C-5C of FIG. 5A.
Figure 5D:
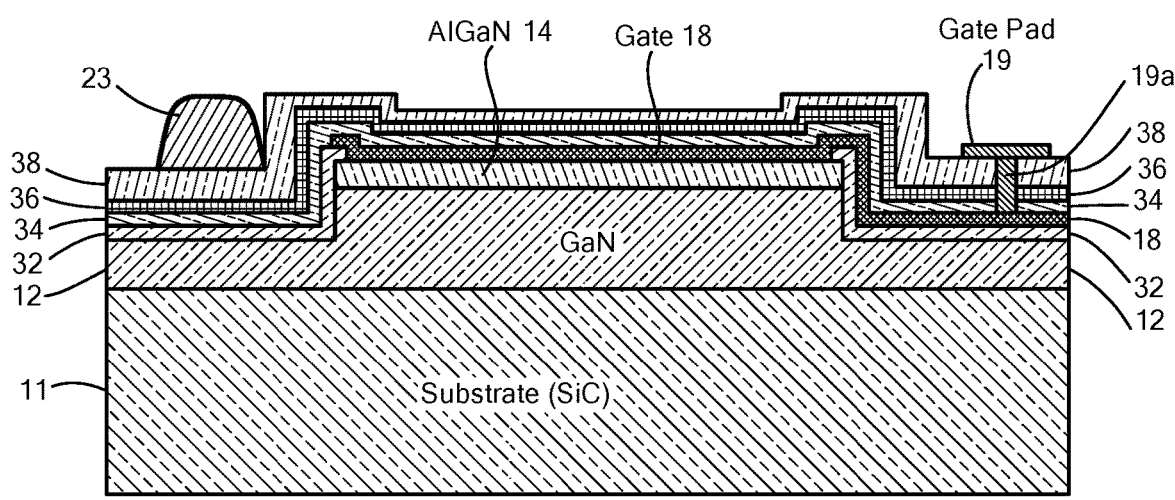
FIG. 5D is a simplified, diagrammatical cross sectional sketch of the Source Connected Field. Plate Field Effect Transistor of FIG. 5A, such cross section being taken along line 5D-5D of FIG. 5A.

Another type of SCFP FET structure 10', here a U-shaped SCFP where the SCFP connector 23 is off of the active region mesa 14, is shown in FIGS. 5A, 5B, 5C and 5D. Here, after forming the structure shown in FIG. 4J, the metal layer 22a is deposited over the structure and patterned as shown in FIG. 5A using any conventional lift-off process such as described above in connection with FIGS. 4K and 4K'. It is noted that the upper, connector section of the SCFP structure 22 extends along the surface of the dielectric layer 38 from above the source electrode structure 16, but is outside of the active region 14, (that is off of the mesa 14; or to put it another way, the SCFP connector section 23 of the SCFP structure 22 is not vertically above the semiconductor layer 14, FIG. 5B), and terminates at the end 27). Thus, the field plate structure 22 does not extend above a region R between the gate electrode structure 18 and the drain electrode structure 20. Here again the gate 18 is connected to the gate pad 19 through a conductive via 19a, as shown in FIG. 5D.

Figure 6A:
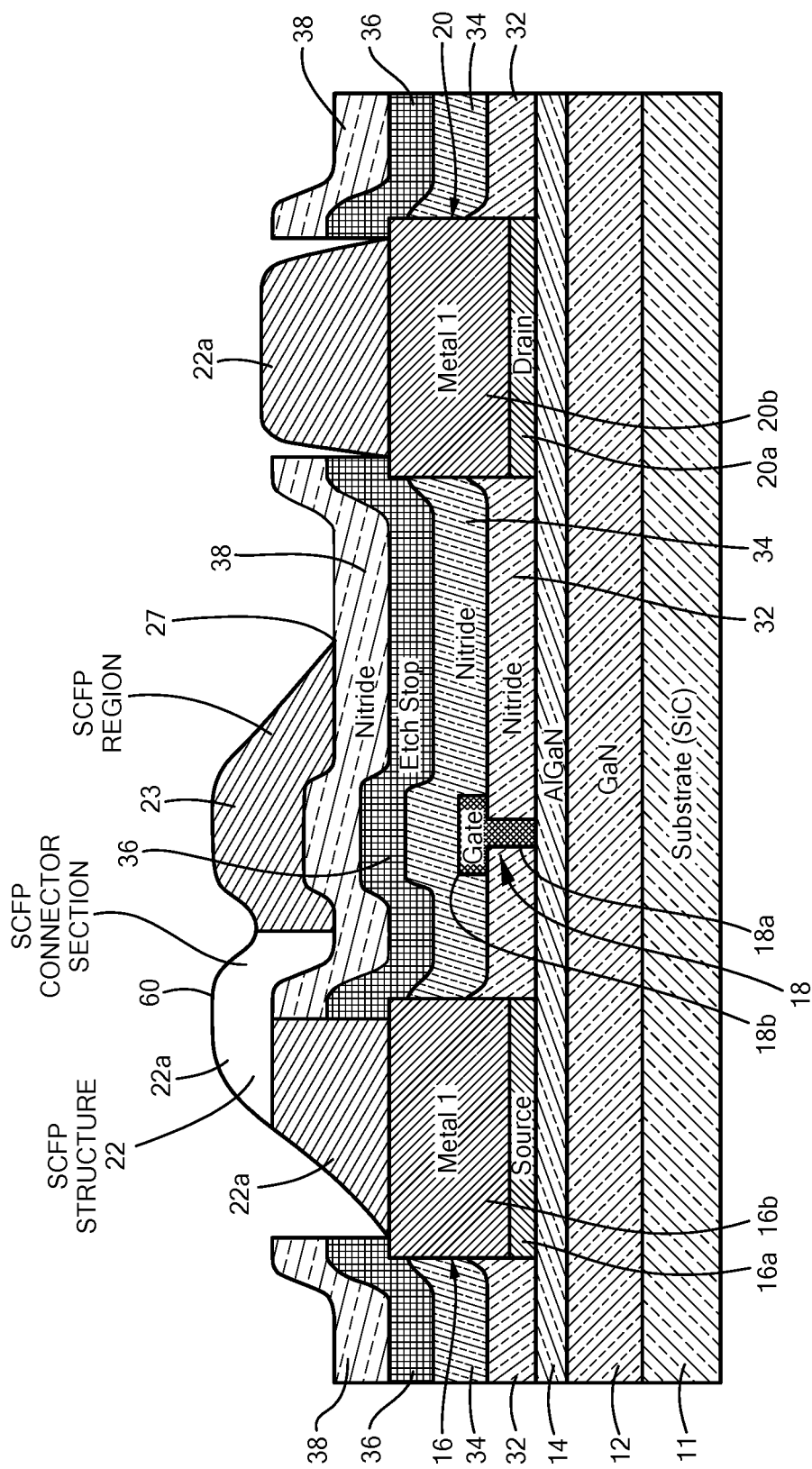
FIGS. 6A-6B are simplified, diagrammatical cross sectional sketches of the Source Connected Field Plate Field Effect Transistor of FIGS. 5A and 5B at various stages in the fabrication thereof according to the disclosure.
Figure 6B:
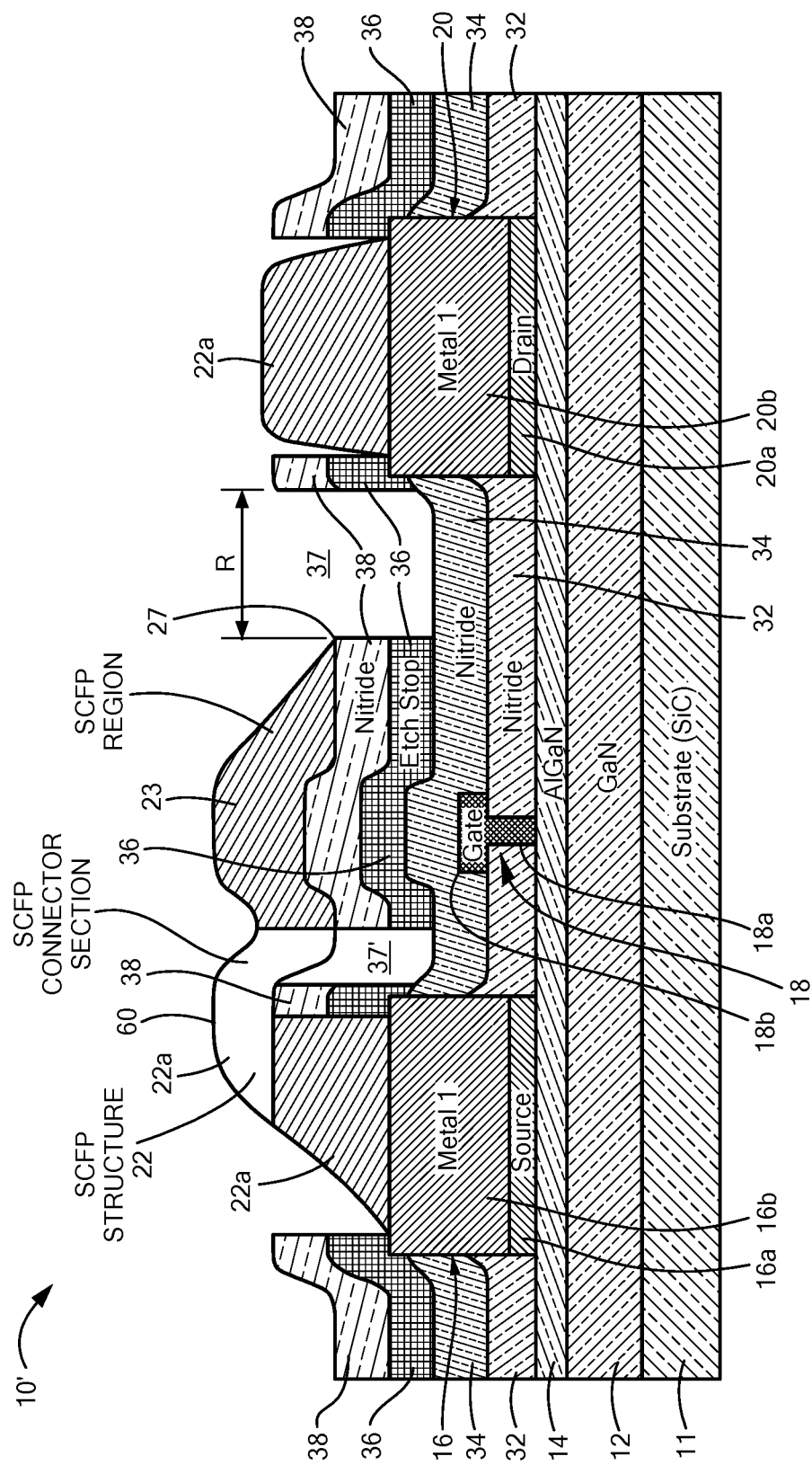

Referring also to FIGS. 6A and 6B; here in addition to the gap 37 being formed over the Region R through layers 38, and 34 as described above in connection with FIGS. 4M and 4N, a second gap 37'; is formed, in like manner, simultaneously with gap 37 between the source 16 and the gate 18, as shown in FIG. 5B. It is also noted that here an additional gap 37' (FIGS. 5A and 5B); is formed over the semiconductor layer 16 between the source electrode structure as shown, using the same etching process described above in connection with FIGS. 4M and 4N to form gap 37. Thus both gap 37 and gap 37' terminate at the silicon nitride layer 34, as shown in FIGS. 5A and 5B. In this regard, the gap 37' is formed through the dielectric layer 38 and through the etch stop layer 36 in the region over the mesa or semiconductor layer 14 and does not extend in the region outside of the mesa or semiconductor layer 14 which supports the SCFP connection section 23 of the SCFP structure 22. Thus, the total thickness of stacks having layers 32 and 34 under the gap 37 and under gap 37' is less than the thickness a stack having layers 32, 34, 36 and 38. In other words, the gaps 37 and 37' have reduced the thickness of the dielectric structure between the source 16 and the gate 18 and also reduced the thickness of the dielectric structure the between the gate 18 and the drain 20.

A number of embodiments of the disclosure have been described. Nevertheless, it will be understood that various modifications may be made without departing from the spirit and scope of the disclosure. For example, field plates may be connected to the drain of a FET. Accordingly, other embodiments are within the scope of the following claims.

What is claimed is:

1. A Field Effect Transistor (FET), comprising:
a first electrode structure, gate electrode structure, and second electrode structure disposed laterally along a surface of a semiconductor, the gate electrode structure controlling a flow of carriers between the first electrode structure and the second electrode structure;
a field plate structure: having one end connected to the first electrode structure; and having a second end disposed between the gate electrode structure and the second electrode structure, the second end being separated from the second electrode structure by a gap;
a dielectric structure, disposed over the semiconductor, having: a first portion disposed under the second end of the field plate structure; and, a second portion disposed under the gap;
wherein the second portion is thinner than the first portion; and
wherein the first portion of the dielectric structure comprises: a bottom layer; an intermediate layer disposed on the bottom layer; and an upper layer disposed on the intermediate layer, the boom layer, the intermediate layer and the upper layer being disposed on the gate electrode: wherein the second portion of the dielectric layer is disposed under the gap and comprises an extended portion of the bottom layer; and wherein the intermediate layer is a material different from the upper layer and the bottom layer, and wherein the intermediate layer and the upper layer terminate at the gap.

2. The Field Effect Transistor (FET) recited in claim 1 wherein the Field Effect Transistor (FET) is a source connected field plate Field Effect Transistor (FET).

3. The Field Effect Transistor (FET) recited in claim 1 including a second gap in a third portion of the dielectric structure, the second gap being disposed between the first electrode structure and the gate electrode structure; and, wherein third portion of the dielectric structure is thinner under the second gap than the first portion of the dielectric structure.

4. The Field Effect Transistor (FET) recited in claim 1 wherein the second end terminates in an outer edge and wherein the outer edge is separated from the second electrode structure by the gap.

5. The Field Effect Transistor (FET) recited in claim 1 wherein the entire field plate structure is disposed outside of the gap.

6. A Field Effect Transistor (FET), comprising:
a first electrode structure, gate electrode structure, and second electrode structure disposed laterally along a surface of a semiconductor, the gate electrode structure controlling a flow of carriers between the first electrode structure and the second electrode structure;
a field plate structure: having one end connected to the first electrode structure; and having, a second end disposed between the gate electrode structure and the second electrode structure, the second end being separated from the second electrode structure by a gap;
a dielectric structure, disposed over the semiconductor, having: a first portion disposed under the second end of the field plate structure; and, a second portion disposed under the gap;
wherein the second portion is thinner than the first portion; and
wherein the first portion of the dielectric structure comprises: a bottom layer; an intermediate layer disposed on the bottom layer, and an upper layer disposed on the intermediate layer, the bottom layer, the intermediate layer and the upper layer being disposed on the gate electrode; wherein the second portion of the dielectric layer is disposed under the gap and comprises an extended portion of the bottom layer, wherein the upper layer and the bottom layer are of the same material; and wherein the intermediate layer is a material different from the upper layer and the bottom layer; and
wherein the intermediate layer and the upper layer terminate at the gap.

7. A Field Effect Transistor (FET), comprising:
a first electrode structure, gate electrode structure, and second electrode structure disposed laterally along a surface of a semiconductor, the gate electrode structure controlling a flow of carriers between the first electrode structure and the second electrode structure;
a field plate structure: having one end connected to the first electrode structure; and having a second end disposed between the gate electrode structure and the second electrode structure, the second end being separated from the second electrode structure by a gap;
a dielectric structure, disposed over the semiconductor, having: a first portion disposed under the second end of the field plate structure; and, a second portion disposed under the gap;
wherein the second portion is thinner than the first portion; and
wherein the first portion of the dielectric structure comprises: a bottom layer; an intermediate layer disposed on the bottom layer; and an upper layer disposed on the intermediate layer; wherein the second portion of the dielectric layer comprises an extended portion of the bottom layer; wherein the intermediate layer is an etch stop layer; the bottom layer, intermediate layer and the upper layer being disposed on the gate electrode; and
wherein the intermediate layer and the upper layer terminate at the gap.

8. The FET recited in claim 7 wherein the bottom layer and the upper layer have an etch rate to a predetermined etchant at least an order of magnitude greater than the etch rate of the intermediate layer.

9. The FET recited in claim 8 wherein the intermediate layer has an etch rate faster than the etch rate of the bottom layer to an etchant different from the first-mentioned predetermined etchant.

10. A Field Effect Transistor (FET), comprising:
a semiconductor;
source, drain, and gate electrode structures disposed laterally along a surface of the semiconductor;
a dielectric structure extending laterally over the surface of the semiconductor;
a field plate structure connected at one end to one of the source and drain electrode structures and having a second end disposed over a first region of the semiconductor between the gate electrode and the other one of the source and drain electrode structures, the second end of the field plate structure being spaced from said other one of the source and drain electrode structures by a gap; and
wherein the dielectric structure comprises:
  a first portion disposed vertically between the second end of the field plate structure and the semiconductor; and,
  a second portion having a thickness thinner than the first portion and disposed over a second region of the surface of the semiconductor under the gap; and
  wherein the first portion of the dielectric structure comprises: a bottom layer; an intermediate layer disposed on the bottom layer; and an upper layer disposed on the intermediate layer, the bottom layer, the intermediate layer and the upper layer being disposed on the gate electrode; wherein the second portion of the dielectric layer is disposed under the gap and comprises an extended portion of the bottom layer; and wherein the intermediate layer is a material different from the upper layer and the bottom layer, and wherein the intermediate layer and the upper layer terminate at the gap.

11. A Field Effect Transistor (FET), comprising:
a semiconductor;
source, drain, and gate electrode structures disposed laterally along a surface of the semiconductor;
a dielectric structure extending laterally over the surface of the semiconductor;
a field plate structure connected at one end to one of the source and drain electrode structures and having a second end disposed over a first region of the semiconductor between the gate electrode and the other one of the source and drain electrode structures, the second end of the field plate structure being spaced from said other one of the source and drain electrode structures by a gap; and
wherein the dielectric structure comprises:
  a first portion disposed vertically between the second end of the field plate structure and the semiconductor; and,
  a second portion having a thickness thinner than the first portion and disposed over a second region of the surface of the semiconductor under the gap; and
  wherein the first portion of the dielectric structure comprises: a bottom layer; an intermediate layer disposed on the bottom layer; and an upper layer disposed on the intermediate layer, the bottom layer, the intermediate layer and the upper layer being disposed on the gate electrode; wherein the second portion of the dielectric layer is disposed under the gap and comprises an extended portion of the bottom layer; and wherein the intermediate layer is a material different from the upper layer and the bottom layer, and wherein the intermediate layer and the upper layer terminate at the gap.

12. The Field Effect Transistor (FET) recited in claim 11 wherein the intermediate layer is disposed in direct contact with the bottom layer; and the upper layer is disposed in direct contact with the intermediate layer; wherein the bottom layer and upper layer are of the same material.

13. The Field Effect Transistor (FET) recited in claim 12 wherein the intermediate layer is an etch stop layer.

14. A Field Effect Transistor (FET), comprising:
a semiconductor;
source, drain, and gate electrode structures disposed laterally along a surface of the semiconductor;
a dielectric structure extending laterally over the surface of the semiconductor;
a field plate structure connected at one end to one of the source and drain electrode structures and having a second end disposed over a first region of the semiconductor between the gate electrode and the other one of the source and drain electrode structures, the second end of the field plate structure being spaced from said other one of the source and drain electrode structures by a gap; and
wherein the dielectric structure comprises:
  a first portion disposed vertically between the second end of the field plate structure and the semiconductor; a second portion having a thickness thinner than the first portion and disposed over a second region of the surface of the semiconductor under the gap; and
  wherein the first portion of the dielectric structure comprises: a bottom layer; an intermediate layer disposed on the bottom layer; and an upper layer disposed on the intermediate layer, the bottom layer, the intermediate layer and the upper layer being disposed on the gate electrode; wherein the intermediate layer is an etch stop layer; wherein the second portion of the dielectric layer is disposed under the gap and comprises an extended portion of the bottom layer; wherein the upper layer and the bottom layer are of the same material; and wherein the intermediate layer is a material different from the upper layer and the bottom layer, and wherein the intermediate layer and the upper layer terminate at the gap.

15. The FET recited in claim 14 wherein the bottom layer and the upper layer have an etch rate to a predetermined etchant at least an order of magnitude greater than the etch rate of the intermediate layer.

16. The FET recited in claim 14, wherein the intermediate layer has an etch rate faster than the etch rate of the bottom layer to an etchant different from the first-mentioned predetermined etchant.

17. A Field Effect Transistor (FET), comprising:
a first electrode structure, second electrode structure and third electrode structure disposed laterally along a surface of a semiconductor, the second electrode structure controlling a flow of carriers between the first electrode structure and the third electrode structure;
a field plate structure: having one end connected to the first electrode structure; and having a second end disposed between the second electrode structure and the third electrode structure and separated from the third electrode structure by a gap; and
a dielectric structure, disposed over the semiconductor, having: a first portion disposed under the second end of the field plate structure; and, a second portion disposed under the gap; and
wherein the second portion is thinner than the first portion; and wherein the first portion of the dielectric structure comprises: a bottom layer; an intermediate layer disposed on the bottom layer; and an upper layer disposed on the intermediate layer, the bottom layer, the intermediate layer and the upper layer being disposed on the gate electrode; wherein the second portion of the dielectric layer is disposed under the gap and comprises an extended portion of the bottom layer;

wherein the upper layer and the bottom layer are of the same material; and wherein the intermediate layer is a material different from the upper layer and the bottom layer, and wherein the intermediate layer and the upper layer terminate at the gap.

18. The Field Effect Transistor (FET) recited in claim 17 including a second gap in a third portion of the dielectric structure, the second gap being disposed between the first electrode structure and the second electrode structure; and, wherein third portion of the dielectric structure is thinner under the third gap than the first portion of the dielectric structure.

\* \* \* \* \*